(12) United States Patent
Kurome et al.

(10) Patent No.: US 7,307,421 B2
(45) Date of Patent: Dec. 11, 2007

(54) MAGNETIC RESONANCE IMAGING DEVICE

(75) Inventors: Akira Kurome, Kashiwa (JP); Kenji Sakakibara, Kashiwa (JP); Hirotaka Takeshima, Ryuugasaki (JP); Takeshi Yatsuo, Kashiwa (JP); Hiroyuki Watanabe, Hitachi (JP); Yoshihide Wadayama, Hitachi (JP); Hirofumi Motoshiromizu, Hitachinaka (JP); Kunihito Suzuki, Hitachi (JP)

(73) Assignees: Hitachi Medical Corporation, Tokyo (JP); Hitachi Ltd., Tokyo (JP); Hitachi Engineering Co., Ltd., Ibaraki (JP)

( * ) Notice: Subject to any disclaimer, the term of this patent is extended or adjusted under 35 U.S.C. 154(b) by 0 days.

(21) Appl. No.: 10/554,164

(22) PCT Filed: Apr. 22, 2004

(86) PCT No.: PCT/JP2004/005781

§ 371 (c)(1),
(2), (4) Date: Oct. 21, 2005

(87) PCT Pub. No.: WO2004/093681

PCT Pub. Date: Nov. 4, 2004

(65) Prior Publication Data

US 2006/0220646 A1     Oct. 5, 2006

(30) Foreign Application Priority Data

| Apr. 23, 2003 | (JP) | ............................. 2003-117804 |
| Jan. 23, 2004 | (JP) | ............................. 2004-015232 |
| Apr. 19, 2004 | (JP) | ............................. 2004-122723 |

(51) Int. Cl.
*G01V 3/00* (2006.01)
(52) U.S. Cl. ...................................................... 324/318
(58) Field of Classification Search ................. 324/318
See application file for complete search history.

(56) References Cited

U.S. PATENT DOCUMENTS

| 2003/0107376 A1* | 6/2003 | Yasuhara ..................... 324/318 |
| 2004/0251901 A1* | 12/2004 | Tsuda et al. ................. 324/318 |
| 2005/0068032 A1* | 3/2005 | Harvey et al. ............... 324/318 |
| 2005/0083056 A1* | 4/2005 | Harvey et al. ............... 324/318 |

FOREIGN PATENT DOCUMENTS

| JP | 10-328159 | 12/1998 |
| JP | 2002-017705 | 1/2002 |
| JP | 2002-017709 | 1/2002 |
| JP | 2002-143123 | 5/2002 |
| JP | 2002-153441 | 5/2002 |

\* cited by examiner

*Primary Examiner*—Brij Shrivastav
*Assistant Examiner*—Megann E Vaughn
(74) *Attorney, Agent, or Firm*—Cooper & Dunham LLP

(57) ABSTRACT

An MRI apparatus having a configuration that reduces vibration of a static magnetic field generating source is provided. A closed vessel 2 of the static magnetic field generating source is provided with a rigid structure 4 for preventing transmission of vibration generated from a gradient magnetic field generating part 21 to other members via the closed vessel 2. The rigid structure 4 uses, for example, a connecting part 4 that connects a face 25 on the imaging space side and a face 26 confronting it. The rigidity of the closed vessel is thereby increased, and therefore vibration transmitted from the gradient magnetic field generating part can be reduced. The connecting part can have a through-hole structure, and in such a case, internal space of through-hole can be used for drawing cables.

28 Claims, 18 Drawing Sheets

MAGNETIC RESONANCE IMAGING DEVICE

TECHNICAL FIELD

The present invention relates to a magnetic resonance imaging apparatus (henceforth referred to as "MRI apparatus").

BACKGROUND ART

MRI apparatuses include those of a type using one pair of opposingly disposed static magnetic field generating sources, in which a uniform static magnetic field region is formed in the space between the pair of static magnetic field generating sources. An imaging portion of a subject is disposed in this uniform static magnetic field region and imaged. An MRI apparatus using opposingly disposed static magnetic field generating sources has advantages that it can give open feeling to a subject, and the subject is more easily accessed by an operator compared with an MRI apparatus of a type using a cylindrical static magnetic field generating source. As the static magnetic field generating source, a permanent magnet, resistive type magnet or superconducting magnet is generally used.

A gradient magnetic field generating coil and a high frequency magnetic field generating coil are disposed on the surface on the imaging region side of each of the pair of static magnetic field generating sources. Because a pulse current flows in the gradient magnetic field generating coil in accordance with an imaging pulse sequence, it generates vibration due to the Lorentz force. Therefore, there is a problem that this vibration is transmitted from the body of the gradient magnetic field generating coil via cables thereof to the static magnetic field generating source, and thus the static magnetic field generating source vibrates.

Japanese Patent Unexamined Publication (KOKAI) No. 2002-52004 discloses a structure in which a gradient magnetic field coil is supported by a supporting system disposed through a hole provided at the center of a static magnetic field generating source. This supporting system is not in contact with the static magnetic field generating source, and is mechanically separated form a supporting system of the static magnetic field generating source. Transmission of vibration generated by the gradient magnetic field generating coil to the static magnetic field generating source is thereby suppressed.

However, in the configuration described in Japanese Patent Unexamined Publication (KOKAI) No. 2002-52004 mentioned above, the gradient magnetic field coil is supported by the supporting system at the central part thereof, and therefore the gradient magnetic field coil is likely to deform and also generate vibration. For this reason, it becomes difficult to improve the performances of the gradient magnetic field coil (for example, linearity of the gradient magnetic field, low vibration property of the gradient magnetic field coil etc.). Moreover, vibration is generated also in cables connected in order to supply a current to the gradient magnetic field coil, and reduction of this vibration is not taken into consideration. Furthermore, how to draw cables for supplying a current to the gradient magnetic field coil and piping for circulating cooling water to the outside is not taken into consideration, either.

DISCLOSURE OF THE INVENTION

An object of the present invention is to provide an MRI apparatus having a configuration that reduces vibration of a gradient magnetic field coil and cables.

To achieve the aforementioned object, in the MRI apparatus according to the first embodiment of the present invention, a static magnetic field generating source comprises a magnetic field generating-coil and a closed vessel enclosing the magnetic field generating coil inside, and the closed vessel has a rigid structure in order to prevent transmission of vibration generated by a gradient magnetic field generating part to other members via the closed vessel. The gradient magnetic field generating part is supported on a face of the closed vessel on the imaging space side. Because the closed vessel has a rigid structure, it becomes unlikely to vibrate, thereby vibration generated in the closed vessel by vibration of the gradient magnetic field generating part can be suppressed, and vibration of the gradient magnetic field generating part fixed on such a closed vessel can be suppressed. Furthermore, because vibration of the closed vessel itself is suppressed, transmission of vibration from the gradient magnetic field generating part to other members via the closed vessel can be prevented.

The aforementioned rigid structure can comprise at least one connector which connects a face on the imaging space side and an opposite face of the closed vessel inside the closed vessel. By connecting the confronting faces of the closed vessel as described above, the rigidity of the closed vessel can be improved.

The aforementioned rigid structure can further comprise a rigid reinforcing member fixed on a face confronting the face on the imaging space side of the closed vessel. The rigidity of the face of the closed vessel confronting the face on the imaging space side is thereby improved, and the rigidity of the face on the imaging space side is also indirectly improved via a connecting part. As a result, the rigidity of the closed vessel as a whole can be improved without using a larger thickness for the face on the imaging space side, and at the same time, it becomes possible to secure a large imaging volume.

The aforementioned rigid reinforcing member can comprise at least one of a plate member and a grid member. When a grid member is used as the rigid reinforcing member, the rigidity can be enhanced with a smaller weight of the closed vessel. That is, by using a grid member, weight increase of the closed vessel due to use of the rigid reinforcing member can be reduced.

The aforementioned plate member can be integrally formed with the closed vessel by thickening a wall of the face confronting the face on the imaging space side of the closed vessel compared with the wall thickness of the face on the imaging space side. The rigidity of the closed vessel can be thereby further enhanced.

The aforementioned gradient magnetic field generating part can be integrated with the closed vessel by fixing the part to the closed vessel with a fixing means. Integration of the gradient magnetic field generating part with the closed vessel that has an enhanced rigidity by the rigid structure and thus is unlikely to vibrate enables suppression of vibration of the gradient magnetic field generating part.

Each closed vessel mentioned above can have a first recess formed on the face on the imaging space side. In this case, each gradient magnetic field generating part is fixed in the first recess. The connecting part includes one or more through-holes penetrating from the face on the imaging space side to the confronting face in the inside thereof. In at least one of the through-holes, cables for gradient magnetic field for supplying a current to the gradient magnetic field generating part can be disposed. By disposing the gradient magnetic field generating part in the first recess as described above, a large region of the imaging space can be secured. By using the through-holes as the connecting part of the closed vessel and disposing cables for gradient magnetic field therein, it becomes unnecessary to lay cables for gradient magnetic field on the imaging space side, thus a large imaging volume can be secured, and the phenomenon that vibration of the cables transmits to the closed vessel can be ameliorated.

The aforementioned closed vessel can have a second recess in the face confronting the face on the imaging space side, and the rigid reinforcing member can be disposed inside the second recess. The weight of the closed vessel can be thereby reduced. That is, increase of the weight of the closed vessel due to use of the rigid reinforcing member can be reduced by providing the second recess.

As for arrangement of the aforementioned through-holes, they can be provided adjacent to the side of the first recess.

As for arrangement of the aforementioned through-holes, at least one of the through-holes can be provided at an approximate center of the first recess.

The aforementioned rigid reinforcing member can have pathways communicating with the through-holes inside, and cables for gradient magnetic field can be disposed in one of the pathways.

In the aforementioned MRI apparatus, a means for circulating a refrigerant for cooling the gradient magnetic field generating part can be further disposed. In such a case, the gradient magnetic field generating part can be provided with a means for passing the refrigerant inside. In this case, piping for supplying the refrigerant to the gradient magnetic field generating part may be disposed in at least one of the through-holes and a pathway communicating therewith.

In the aforementioned MRI apparatus, a pair of high frequency magnetic field generating parts for generating a high frequency magnetic field in the imaging space can be further disposed. Each of the pair of high frequency magnetic field generating parts is disposed on the imaging space side with respect to the gradient magnetic field generating part. In at least one of the through-holes and a pathway communicating therewith, cables for high frequency magnetic field for supplying a current to the high frequency magnetic field generating part can be disposed.

It is possible to provide three or more through-holes in the aforementioned closed vessel, and the cables for gradient magnetic field, cables for high frequency magnetic field and piping can be disposed individually in either of separate through-holes and in either of separate pathways. The aforementioned pathways can join inside the rigid reinforcing member and communicate with the outside of the rigid reinforcing member as pathways of a smaller number than the number of the through-holes. In the joined pathways, there can be provided a partition that separates a space through which the cables for gradient magnetic field or the cables for high frequency magnetic field run and a space through which the piping runs, and the partition may be constituted with a material of high thermal conductivity. The aforementioned piping can be disposed at a position perpendicularly under the cables for gradient magnetic field or the cables for high frequency magnetic field.

The aforementioned through-hole can have an opening inside the first recess, the gradient magnetic field generating part can have a current receiving terminal at a position of the opening of the through-hole, and the cables for gradient magnetic field can have a current supplying terminal, wherein the current supplying terminal is connected to the current receiving terminal.

The aforementioned cables for gradient magnetic field can be fixed in the through-hole with a fixing member. Vibration transmitted via cables to the closed vessel can be thereby further reduced.

The aforementioned through-hole can have an opening inside the first recess, the gradient magnetic field generating part can be configured to have a refrigerant receiving terminal at a position of the opening of the through-hole, and the piping can have a refrigerant supplying terminal, wherein the refrigerant receiving terminal is connected to the refrigerant supplying terminal.

The aforementioned piping, refrigerant supplying terminal and refrigerant receiving terminal can be constituted with a conductive material, so that they can serve also as the cables for gradient magnetic field supplying an electric current to the gradient magnetic field generating part.

BEST MODE FOR CARRYING OUT THE INVENTION

Embodiments of the magnetic resonance imaging apparatus (MRI apparatus) according to the present invention will be explained with reference to the drawings.

First Embodiment

Figure 1:
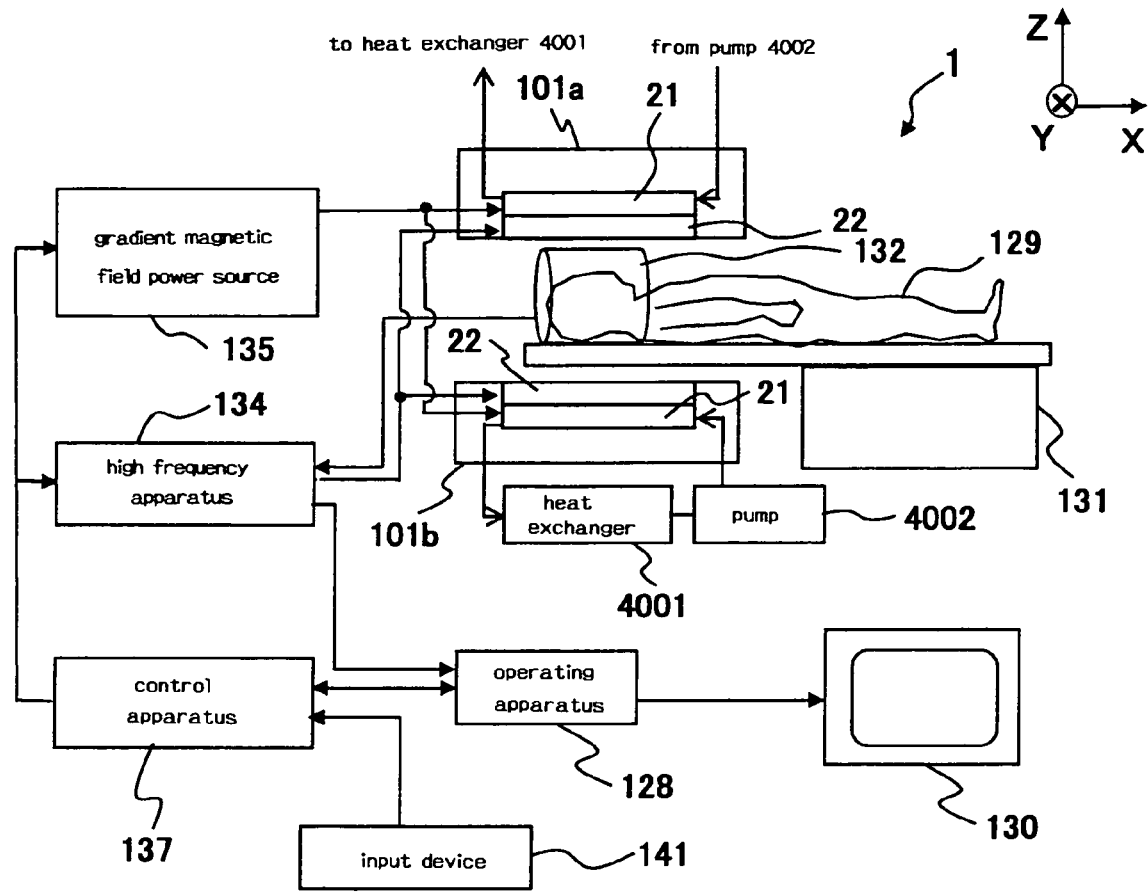
FIG. 1 is a block diagram showing overall configuration of the MRI apparatus according to the first embodiment.
Figure 33:
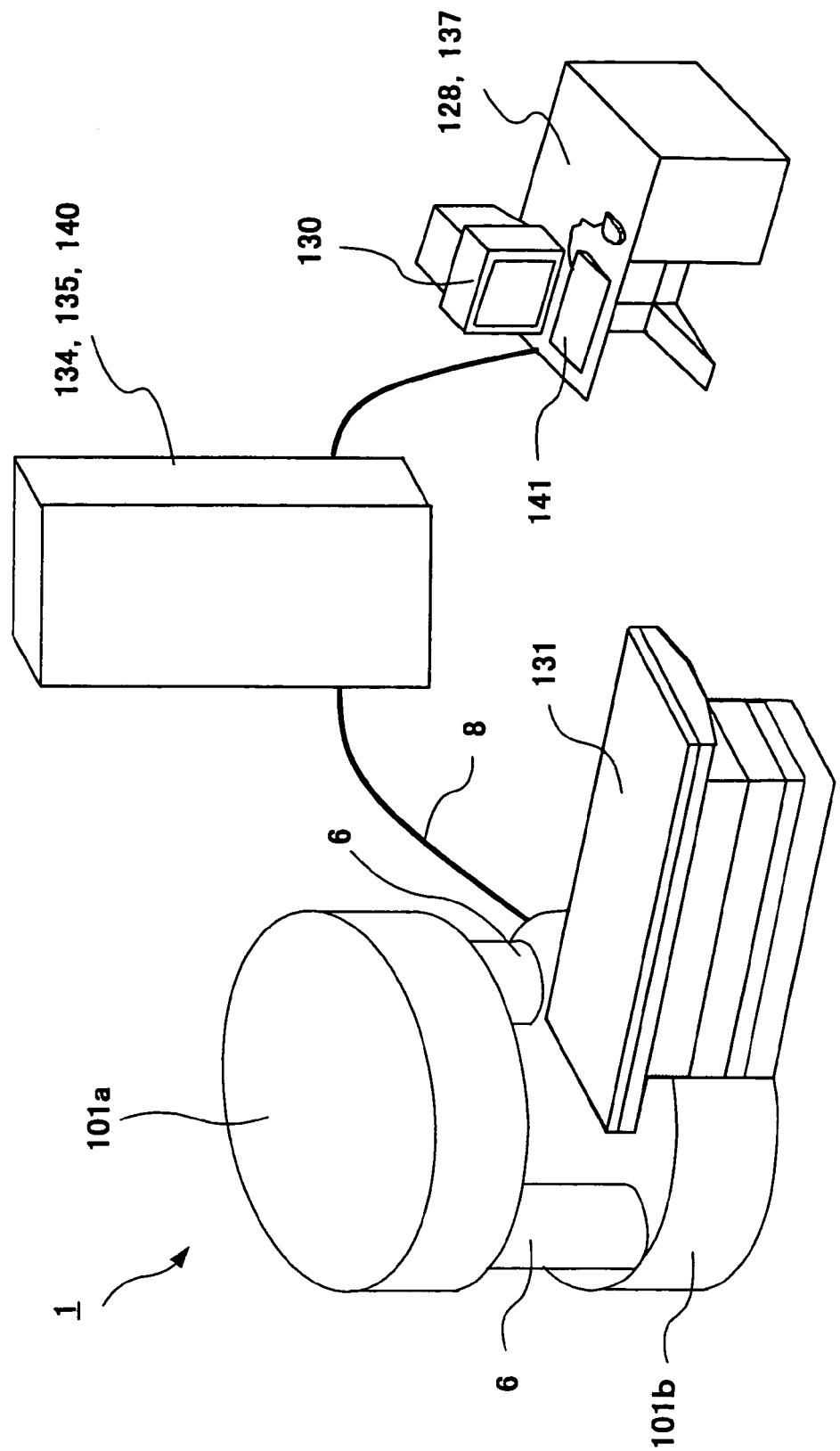
FIG. 33 is a perspective view showing overall configuration of the MRI apparatus according to the first embodiment of the present invention.

The MRI apparatus according to the first embodiment comprises, as a whole view thereof is shown in FIGS. 1 and 33, a static magnetic field generating apparatus 1, a gradient magnetic field coil 21, a high frequency irradiating coil 22, a bed 131 on which a subject 129 is laid, and a high frequency receiving coil 132. Besides these, the apparatus includes a gradient magnetic field power source 135, a high frequency apparatus 134, a control apparatus 137, an operating apparatus 128, an input device 141 and a display 130 as control and operation systems. Moreover, as shown in FIG. 1, the apparatus also comprises a heat exchanger 4001 and a pump 4002, which supply a refrigerant such as cooling water to the gradient magnetic field coil 21.

Figure 2:
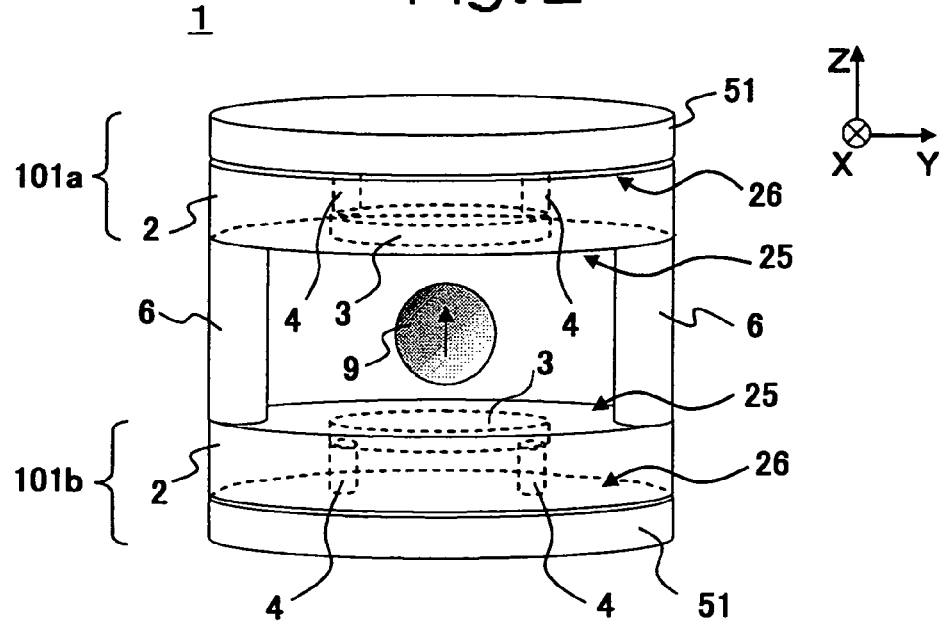
FIG. 2 is a perspective view of a static magnetic field generating apparatus 1 of the MRI apparatus according to the first embodiment.
Figure 3:
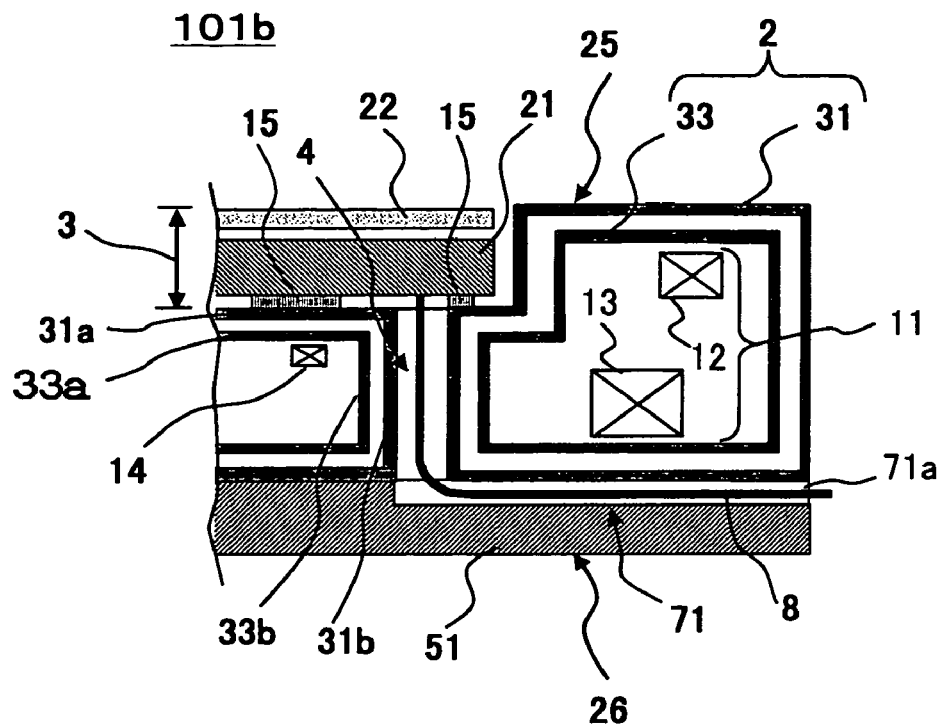
FIG. 3 is a partial sectional view of a lower superconducting magnet 101b of the MRI apparatus according to the first embodiment.

The static magnetic field generating apparatus 1 comprises, as shown in FIGS. 2, 3 and 33, a pair of superconducting magnets 101a and 10b, which are opposingly disposed on the upper side and lower side, and two of connecting columns 6 connecting them. The pair of superconducting magnets 101a and 101b produce an intense and uniform static magnetic field region (imaging volume) 9 in the space between them. The direction of the magnetic field is the direction of Z. The bed 131 carries a subject 129, and an imaging portion is placed in the uniform static magnetic field region 9. The gradient magnetic field coil 21 and the high frequency irradiating coil 22 are disposed on the side of the subject 129 (opposing face side) of the superconducting magnet 101a or 101b as shown in FIG. 1. The high frequency irradiating coil 22 irradiates a high frequency magnetic field pulse having a frequency equal to the Larmor frequency on the imaging portion. Nuclear spins are thereby excited in the subject 129 and emit NMR signals. A receiving coil 132 disposed near the imaging portion detects the emitted NMR signals. The gradient magnetic field coil 21 applies gradient magnetic fields to the uniform static magnetic field region 9 for three directions of X, Y and Z axes in order to add positional information to the NMR signals.

The NMR signals received by the receiving coil 132 are detected by the high frequency apparatus 134 and transmitted to the operating apparatus 128 to perform an image reconstruction operation and so forth. The reconstructed image is outputted to the display 130 and displayed. Further, in addition to the detection of the signals received by the receiving coil 132, the high frequency apparatus 134 also performs supply of high frequency power to the high frequency irradiating coil 22 for generating a high frequency magnetic field pulse. The gradient magnetic field power source 135 supplies a current to the gradient magnetic field coil 21 to generate a predetermined gradient magnetic field. The control apparatus 137 controls operations of the gradient magnetic field power source 135 and the high frequency apparatus 134. A predetermined imaging pulse sequence instructed by an operator via the input device 141 is thereby executed. Further, an image desired by the operator is reconstructed by controlling operation and processing in the operating apparatus 128.

Hereafter, the detailed structure of the superconducting magnets 101a and 101b will be explained with reference to the sectional view of the superconducting magnet 101b shown in FIG. 3. The superconducting magnets 101a and 101b each comprise a cryostat 2 and a superconducting coil group 11 accommodated inside the cryostat. The cryostat 2 comprises a refrigerant container 33 filled with helium as the refrigerant and a vacuum vessel 31 fixed outside the refrigerant container with a predetermined interval. The superconducting coil group 11 is allocated inside the refrigerant container 33. The space between the refrigerant container 33 and the vacuum vessel 31 is decompressed to a predetermined degree of vacuum. Further, a thermal radiation shielding layer (not shown) is disposed in the vacuum space between the refrigerant container 33 and the vacuum vessel 31 so that the layer should wrap the refrigerant container 33. By such a structure, the temperature of the superconducting coil group 11 is maintained at a temperature below the superconducting transition temperature. As the refrigerant container 33 and the vacuum vessel 31, those made of stainless steel or glass fiber reinforced plastics (GFRP) can be used.

The superconducting coil group 11 has a configuration of active sealed type for preventing leakage magnetic field and comprises the superconducting coil 12 which generates a magnetic field forming the static magnetic field region 9, the superconducting coil 13 for shielding which generates a magnetic field for preventing leakage magnetic field and the superconducting coil 14 for correction for improving uniformity of the static magnetic field. It is also possible to replace the superconducting coil 13 for shielding and the superconducting coil 14 for correction with ferromagnetic substances.

The cryostat 2 has a cylindrical outer shape, and a recess 3 is provided in the wall of the face 25 on the side of the uniform static magnetic field region 9 (opposing face) as shown in FIGS. 2 and 3. That is, the wall 31a of the vacuum vessel 31 constituting the opposing face 25 and the wall 33a of the refrigerant container 33 are depressed in the shape of the recess 3. The gradient magnetic field coil 21 is supported by a fixing part 15 disposed inside the recess 3 and fixed to the cryostat 2. As the means for fixing the gradient magnetic field coil 21 with the fixation part 15, adhesion with adhesive or the like, fastening with bolt or the like and so forth can be used. The high frequency irradiating coil 22 is disposed in the recess 3 on the side of imaging space 9 with respect to the gradient magnetic field coil 21. Further, a shim coil for correcting the static magnetic field can also be disposed in the recess 3 as required. By disposing the gradient magnetic field coil 21, the high frequency irradiating coil 22, the shim coil and so forth in the recess 3 as described above, the gradient magnetic field coil 21, the high frequency irradiating coil 22 and so forth do not protrude into the space between the upper and lower superconducting magnets 101a and 101b. The space between the upper and lower superconducting magnets 101a and 101b can be thereby made large, and therefore open feeling can be given to the subject 129.

Further, as shown in FIG. 2, as for the cryostat 2 for each of the superconducting magnets 101a and 101b, a structure reinforcing member is fixed on the face 26 on the side opposite to the opposing face 25 (non-opposing face). In this embodiment, a thick plate reinforcing member 51 constituted with a material having a high rigidity is used as the structure reinforcing member. The material of the thick plate reinforcing member 51 may be a material having a high rigidity, and for example, a metal or ceramics can be used. A larger thickness of the thick plate reinforcing member 51 is more desirable, because a larger thickness provides a larger rigidity. However, a larger thickness results in a lager weight and also requires a larger space for disposition. Therefore, considering these factors, the member having an appropriate thickness is used. As the method for the fixation of the thick plate reinforcing member 51, for example, a method of firmly anchoring it to the whole or a part of the non-opposing surface 26 of the cryostat 2 by welding, adhesion or the like, or a method of fastening it with many bolts can be used. The thick plate reinforcing member 51 thereby reinforces the rigidity of the non-opposing face 26 of the cryostat 2.

Further, multiple through-holes 4 penetrating from the non-opposing face 26 to the opposing face 25 are provided in the cryostat 2. The wall of each through-hole 4 has a dual-structure consisting of a wall 33b extended from the refrigerant container 33 and a wall 31b extended from the vacuum vessel 31 and thus maintains a heat insulated structure. The walls of the through-holes 4 act as columns supporting the opposing face 25 on the non-opposing face 26. Because the rigidity of the non-opposing face 26 is enhanced by the thick plate reinforcing member 51, the support of the opposing face 25 at multiple positions by the walls of the through-holes 4, of which one ends are fixed to the non-opposing face 26, can enhance the rigidity of the opposing face 25 of the cryostat 2.

Because the superconducting magnets 101a and 101b are required to efficiently generate the static magnetic field region 9 of a strong intensity, it is desirable to make the interval between the walls 31a and 33a of the cryostat 2 and thickness thereof as small as possible, and thereby make the superconducting coil 12 as near the static magnetic field region 9 as possible. For this reason, it is not easy to enhance the rigidity of the opposing face 25 of the cryostat 2. However, according to this embodiment, by disposing the thick plate reinforcing member 51 on the side of the non-opposing face 26 to enhance the rigidity thereof and providing the through-holes 4 penetrating from the non-opposing face 26 to the opposing face 25, the rigidity of the wall of the opposing face 25 can be enhanced without increasing the thickness thereof.

It is known that because a pulse current corresponding to an imaging pulse sequence is supplied to the gradient magnetic field coil 21 fixed in the recess 3 of the opposing face 25 from the gradient magnetic field power source 135, pulsed Lorentz force is induced to generate vibration. This vibration transmits to the walls 31a and 33a of the cryostat 2 on which the gradient magnetic field coil 21 is fixed. However, because the walls 31b and 33b of the through-holes 4 disposed at multiple positions support them as columns, vibration of the walls 31a and 33a constituting the opposing face 25 can be effectively reduced.

As for the number and arrangement of the through-holes 4, a number and arrangement effectively suppressing the vibration are determined by simulation or the like considering frequency of vibration generated in the gradient magnetic field power source 135, characteristic vibration frequency of the cryostat 2, weight, thickness etc. of the thick plate reinforcing member 51 and so forth, and the actual number and positions are determined on the basis of them.

Further, it is necessary to connect wirings (cables) 8 which supply currents from the high frequency apparatus 134, the gradient magnetic field power source 135 and so forth to the high frequency irradiating coil 22 and the gradient magnetic field coil 21 disposed in the recess 3 as well as a shim coil disposed as required. In addition, because a large current is supplied in a short time to the gradient magnetic field coil 21 in order to obtain a gradient magnetic field of a strong intensity, it is necessary to connect a cooling pipe to the coil to supply a refrigerant (for example, water) cooled by the heat exchanger 4001 from a pump 4002 to eliminate the Joule heat generated in a conductor of the coil. Therefore, it is necessary to draw four to six of cables 8 and two cooling pipes from the outside to the inside of the recess 3. Because the cables 8 or the cooling pipes have an outer diameter of about 10 to 30 mm in a usual MRI apparatus, 6 to 10 of the cables or pipes require a considerable space, and if they are disposed along a route overpassing a peripheral portion of the recess 3 of the cryostat 2, the space between the superconducting magnets 101a and 101b is narrowed. Moreover, because the superconducting coil 12 is adjacently disposed to the peripheral portion of the recess 3 of the cryostat 2 in order to effectively generate a static magnetic field, a notch cannot be provided in the peripheral portion.

Therefore, this embodiment employs a configuration in which the cables 8 and cooling pipes are passed through the through-holes 4 to draw them into the recess 3 from the outside. That is, through-holes 71 extending from the through-holes 4 of the cryostat 2 and communicating with the outside are provided in the thick plate reinforcing member 51, and the through-holes 4 and the through-holes 71 are used as ducts for wiring and piping. In the example shown in FIG. 3, a through-hole 71 in the form of groove, which leads from the through-hole 4 to the outer peripheral surface, is formed on the face of the thick plate reinforcing member 51 on the side of the cryostat 2. An opening 71*a* of the through-hole 71 is formed at the outer peripheral surface of the thick plate reinforcing member 51. The cables 8 are drawn into the through-hole 71 of the thick plate reinforcing member 51 from the opening 71*a*, passed through the through-hole 4 of the cryostat 2, drawn into the recess 3 and connected to the gradient magnetic field coil 21, the high frequency irradiating coil 22 and so forth. Further, although not shown in the drawing, the cooling pipes are also drawn into the inside of the recess 3 and connected to the gradient magnetic field coil 21 by passing them through other through-hole 4 and through-hole 71.

The cables 8 and cooling pipes can be thereby connected to the gradient magnetic field coil 21, the high frequency irradiating coil 22 and so forth without passing them through the space between two of the superconducting magnets 101*a* and 101*b*. Therefore, the space between two of the superconducting magnets 101*a* and 101*b* can be maintained to be wide, and open feeling can be given to the subject 129. In addition, access to the subject 129 by an operator also becomes easy.

As described above, according to the configuration of this embodiment, the gradient magnetic field coil 21, the high frequency irradiating coil 22 and so forth can be disposed in the recess 3 of the cryostat 2, and the cables 8 and cooling pipes can be drawn into the recess 3 through the through-holes 4 of the cryostat 2. Therefore, the space between two of the superconducting magnets 101*a* and 101*b* can be maintained to be wide, and open feeling can be given to the subject 129. In addition, because the walls 31*b* and 33*b* of the through-holes 4 act as columns which support the opposing face 25, generation of vibration in the opposing face 25 due to vibration transmitted from the gradient magnetic field coil 21 can be suppressed. Therefore, it is not required to provide a notch at a peripheral portion of the opposing face 25 to draw the cables 8 and so forth or thicken the opposing face 25 for suppression of vibration, and thus the effect of maintaining openness and the effect of suppressing vibration can be simultaneously obtained without affecting the generation of the static magnetic field region 9 by the superconducting coil 12.

The thick plate reinforcing member 51 can be made to have a thickness of, for example, several tens centimeters, and as the material thereof, stainless steel etc. can be used. The number of the through-holes 4 in the cryostat 2 can be three or more, and they can be provided at positions in point symmetry. Further, the diameter of the through-hole 4 is desirably about 15% or less of the diameter of the cryostat 2. This is because if the diameter of the through-hole 4 becomes large, although the structural strength of the cryostat 2 increases, the surface area becomes large, and thus the amount of heat permeating into the refrigerant container 33 increases. In this embodiment, specifically, three of the through-holes 4 are provided, and they have a diameter of about 100 mm. The diameter of the cryostat 2 is slightly less than 2 m, which is similar to that in a usual MRI apparatus.

If the diameter of the through-hole 4 is about 100 mm, the rate of the wall surface area of the cryostat 2 increased due to formation of the through-holes 4 is small, and the heat insulating effect of the cryostat 2 is hardly reduced. Further, if the through-holes 4 have a diameter of about 100 mm, it is possible to pass each of the cables 8 and cooling pipes through them.

Although the configuration that the thick plate reinforcing member 51 and the cryostat 2 are provided as separate members and fixed by anchorage or the like is used in the aforementioned embodiment, it is also possible to form the thick plate reinforcing member 51 and the cryostat 2 as one member by thickening the wall of the cryostat 2 on the side of the non-opposing face 26 (bottom) so as to be similar to the thickness of the plate reinforcing member 51.

Further, although the cables 8 and so forth are drawn to the outer peripheral surface from the through-hole 71 provided in the thick plate reinforcing member 51 in the example shown in FIG. 3, it is of course also possible to use a configuration that the through-holes 71 penetrating the thick plate reinforcing member 51 along the thickness direction are provided, and the cables 8 and cooling pipes are drawn out from the back surface of the thick plate reinforcing member 51. In this case, as for the lower superconducting magnet 101*b*, the cables 8 and cooling pipes can be easily drawn out by providing legs for the thick plate reinforcing member 51 to secure a space between the thick plate reinforcing member 51 and floor.

It is also possible to fix the cables 8 or cooling pipes to the wall surfaces of through-holes 4 and 71 by providing a cushioning member between the wall surface of the through-hole 4 or 71 and the cable 8 or cooling pipe, or filling the space with an adhesive. Transmission of vibration of the gradient magnetic field coil 21 to the superconducting magnet 101*a* or 101*b* via the cables 8 and cooling pipes can be thereby reduced.

Further, in this embodiment, because the cryostat 2 is cooled to a liquid helium temperature, the dual structure of the wall of the through-hole 4 consisting of the wall 31*b* of the vacuum vessel 31 and the wall 33*b* of the refrigerant container 33 is used. However, when the superconducting coil group 11 is not required to be cooled to a liquid helium temperature, it is also possible to use a single structure without providing the wall 33*b* of the refrigerant container 33.

In addition, the cables from the superconducting magnets to the gradient magnetic field power source 135 and the high frequency apparatus 134 are generally disposed at a position near the floor, the cables 8 and cooling pipes connected to the upper superconducting magnet 101*a* can be disposed so that they should be drawn in contact with the side surface of the connecting column 6 and reach the upper superconducting magnet 101*a*.

Second Embodiment

Figure 4:
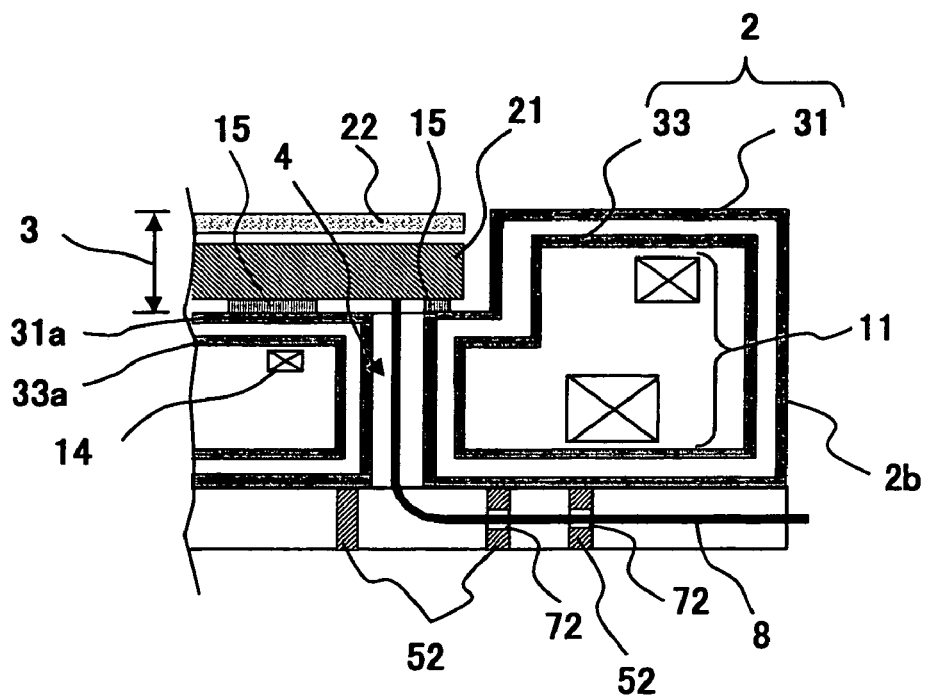
FIG. 4 is a partial sectional view of a lower superconducting magnet 101b of the MRI apparatus according to the second embodiment.
Figure 5A:
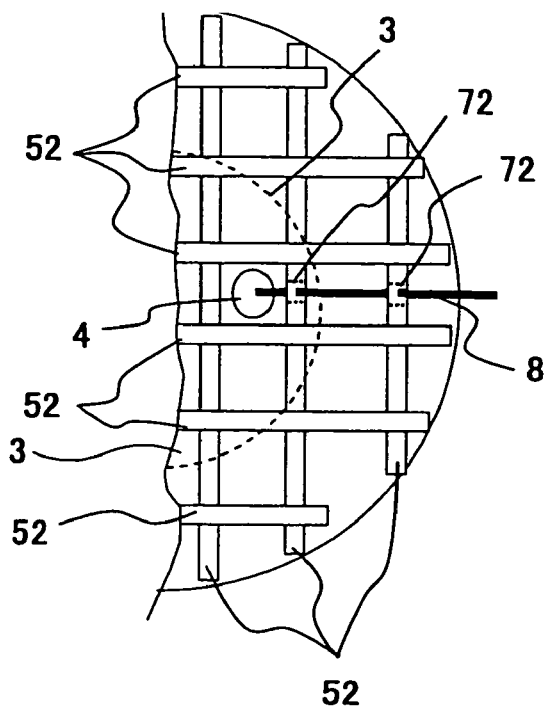
FIG. 5(a) is a lower view of a lower superconducting magnet 101b of the MRI apparatus according to the second embodiment.
Figure 5B:
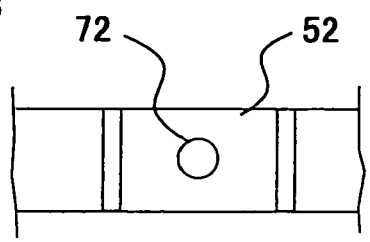
FIG. 5(b) is a partial side view of a grid reinforcing member 52 of the lower superconducting magnet 101.

The MRI apparatus according to the second embodiment of the present invention will be explained by referring to FIGS. 4, 5(*a*) and (*b*). The MRI apparatus according to the second embodiment uses a grid reinforcing member 52 as a reinforcing member fixed to the cryostat 2 instead of the thick plate reinforcing member 51 used in the first embodiment. The other structure is the same as that of the first embodiment. By using the grid reinforcing member 52, it is possible to further reduce the weight compared with the case of using the thick plate reinforcing member 51 while enhancing the rigidity of the cryostat 2. Further, by providing the through-hole 4 at a position corresponding to an opening of the grid, the cables 8 or cooling pipes can be drawn out to the back surface side without providing through-holes in the grid reinforcing member 52. Further, even when the cables 8 etc. are drawn out to the outer peripheral surface side of the grid reinforcing member 52, it is sufficient that only a certain number of through-holes 72 should be provided for the grid as shown in FIG. 4, FIG. 5(*a*) and (*b*), and thus processing becomes easy. However, in order to enhance the vibration suppressing effect, the number of the through-holes 72 and the diameter thereof are desirably made as small as possible.

Third Embodiment

The MRI apparatus of the third embodiment will be explained by referring to FIG. 6. Although the MRI apparatus of the third embodiment uses a thick plate reinforcing member 51 as a reinforcing member like the first embodiment, a thick plate reinforcing member 51 consisting of a plurality of separate members is used. In the example shown in FIG. 5, the circular thick plate reinforcing member 51 is divided into two of members 51*a* and 51*b* in a semicircular shape beforehand, and the members 51*a* and 51*b* are disposed so that a gap 73 should be secured between them and the opening of the through-hole 4 of the cryostat 2 should locate between them. The gap 73 can be thereby used as a pathway for disposing the cables 8 or cooling pipes. Therefore, it is not necessary to form a through-hole 71 like the thick plate reinforcing member 51 shown in FIG. 3, resulting in an advantage that manufacture of the thick plate reinforcing member 51 becomes easy.

Figure 6:
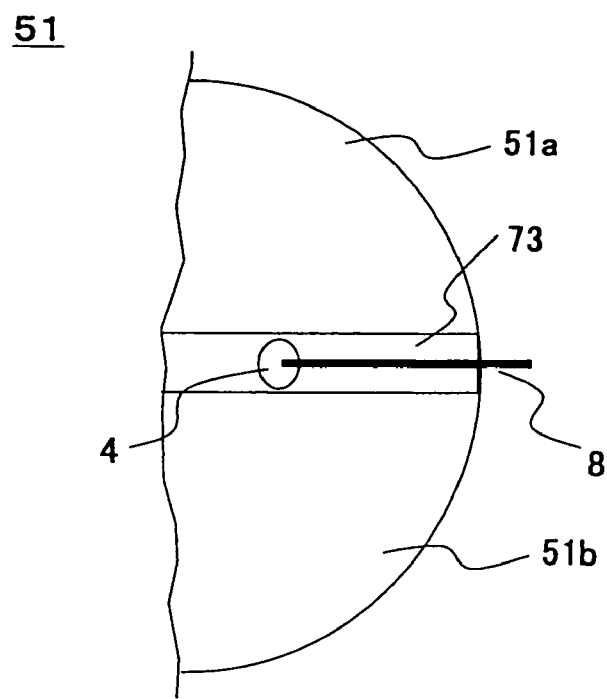
FIG. 6 is a sectional view of a lower part of the lower superconducting magnet 101b of the MRI apparatus according to the third embodiment.

In the example shown in FIG. 6, the gap 73 is provided so that it should across the center of the thick plate reinforcing member 51. However, the configuration of the gap 73 is not limited to this, and the gap 73 is desirably designed considering the vibration frequency of the cryostat 2, characteristic vibration frequency of the thick plate reinforcing member 51 and so forth so that it should be disposed at an optimal position in view of suppression of vibration.

Fourth Embodiment

The MRI apparatus of the fourth embodiment will be explained by referring to FIG. 7. The MRI apparatus of the fourth embodiment has a structure in which not only the recess 3 is provided on the side of opposing face 25 of the cryostat 2, but also a recess 104 is provided on the side of the non-opposing face 26. For the non-opposing face 26, the grid reinforcing member 52 is disposed. The grid reinforcing member 52 is also disposed inside the recess 104.

In general, as already described for the first embodiment, as for the superconducting coil group 11 of the active sealed type, the superconducting coil 12 is disposed on the side of the opposing face 25 near the uniform static magnetic field region 9, and the superconducting coil 14 for correction is also disposed on the side of the opposing face 25. And the superconducting coil 13 for shielding is disposed on the side of the non-opposing face 26. Therefore, because no coil is disposed at the center of the non-opposing face 26, the recess 104 can be provided in this portion. Therefore, the grid reinforcing member 52 can be disposed also in the recess 104, and thus the superconducting magnets 101*a* and 101*b* can be made thinner. Accordingly, the same rigidity as that obtained by the configuration having no recess 104 shown in FIG. 4 can be obtained with thinner superconducting magnets 101*a* and 101*b*. More compact superconducting magnets 101*a* and 101*b* can be thus provided.

Further, by using a large height of the recess 104, it becomes possible to use a large curvature radius for bending the cables 8 and piping. Therefore, it also becomes possible to easily dispose even a cable having a large outer diameter such as the cables 8 of the gradient magnetic field coil 21 and so forth requiring a large current.

Figure 7:
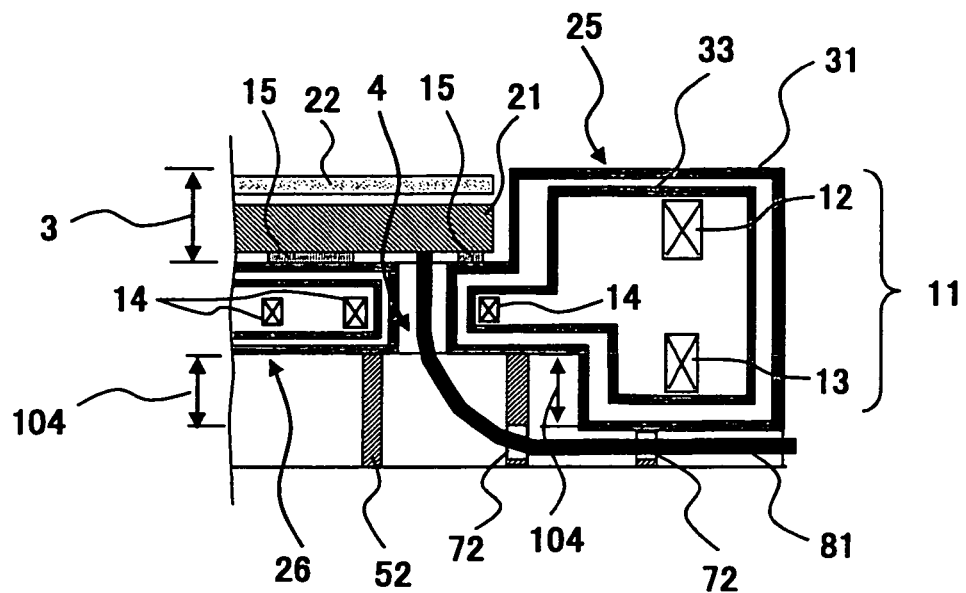
FIG. 7 is a partial sectional view of a lower superconducting magnet 101b of the MRI apparatus according to the fourth embodiment.

In addition, it is also possible to dispose a thick plate reinforcing member 51 of the structure shown in FIG. 2 or a thick plate reinforcing member 51 of the structure shown in FIG. 6 instead of the grid reinforcing member 52 shown in FIG. 7.

Fifth Embodiment

The MRI apparatus of the fifth embodiment will be explained by referring to FIG. 8. In the MRI apparatus of the fifth embodiment, three or more through-holes 4 are provided in the cryostat 2, and three of through-holes 71 connected to three of the through-holes 4, respectively, are radially provided in the thick plate reinforcing member 51. In three of the through-holes 71, cables 81 to the gradient magnetic field coil 21, cables 82 to the high frequency irradiating coil 22 and a cooling pipe 83 to the gradient magnetic field coil 21 are passed through, respectively. By such a configuration, the cables 81 and the cables 82 do not approach each other, influence of induction magnetic field produced by the cables 81 connected to the gradient magnetic field coil 21, in which a large current flows, on signals flowing in the cables 82 connected to the high frequency irradiating coil 22 can be prevented. Further, because the through-hole 71 in which the cooling pipe 83 is disposed is different from the through-holes 71 in which the cables 81 and 82 disposed, respectively, even if leakage of water occurs in the cooling pipe 83, there should be no possibility of wetting of the cables 81 and 82 with water.

Further, because the symmetry of the rigidity of the thick plate reinforcing member 51 can be increased by the radial disposition of the three through-holes 71, even if vibration behavior of the gradient magnetic field coil 21 changes depending on the axis of the gradient magnetic field generated by the gradient magnetic field coil 21, vibration can be suppressed irrespective of the axial direction.

Figure 8:
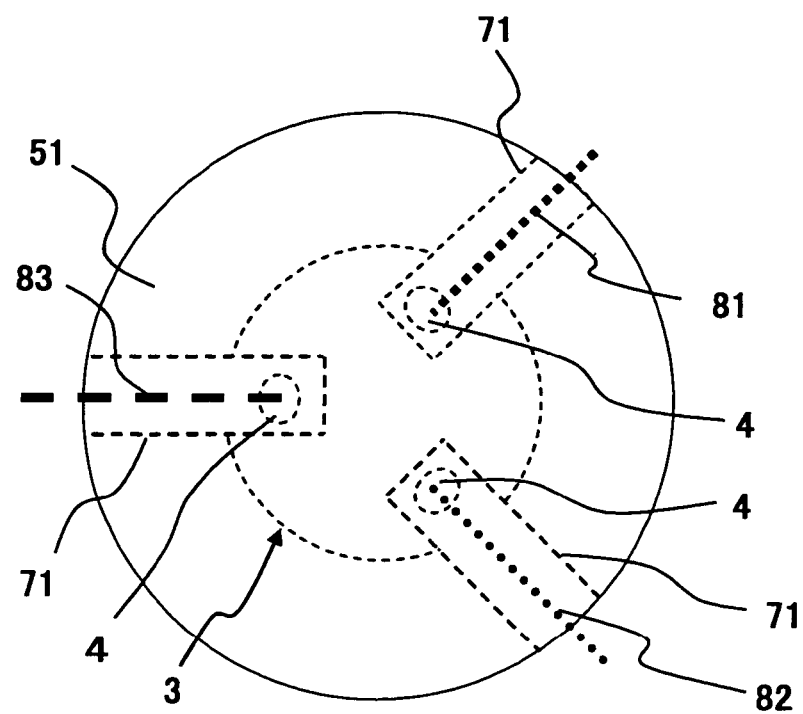
FIG. 8 is a sectional view of a lower part of a lower superconducting magnet 101b of the MRI apparatus according to the fifth embodiment.

In the configuration shown in FIG. 8, three or more through-holes 4 are provided in the cryostat 2, and the cables 81 and 82 and the cooling pipe 83 are drawn out from three of the through-holes 4, respectively. However, it is also possible to provide only one through-hole 4 at the center and draw out the cables 81 and 82 and the cooling pipe 83 from this one through-hole 4. In this case, the radial three through-holes 71 of the thick plate reinforcing member 51 are configured to be connected at the center. It is desirable to dispose a separation plate or the like for electrically separating the cables 81 and 82 and the cooling pipe 83, respectively, at a position at which the cables approach each other.

Sixth Embodiment

Figure 9:
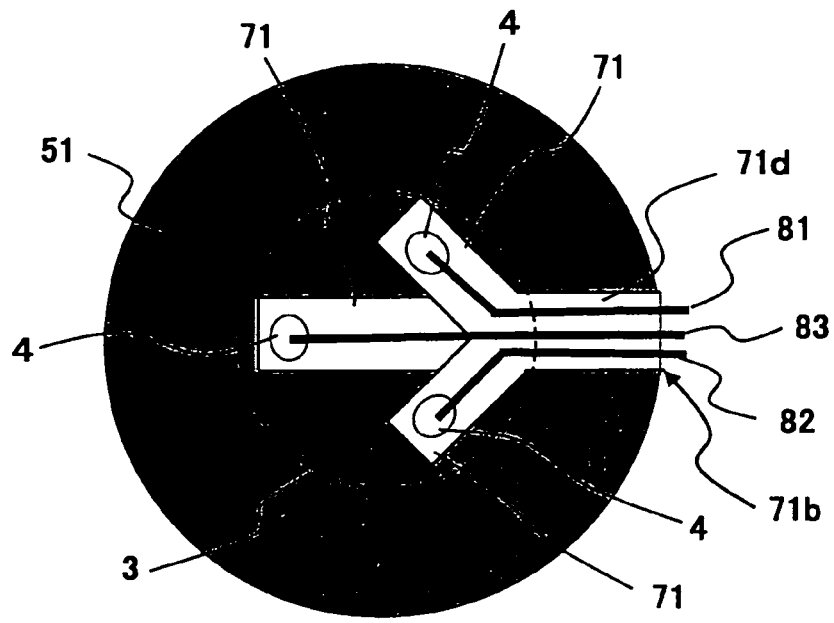
FIG. 9 is a sectional view of a lower part of a lower superconducting magnet 101b of the MRI apparatus according to the sixth embodiment.
Figure 10:
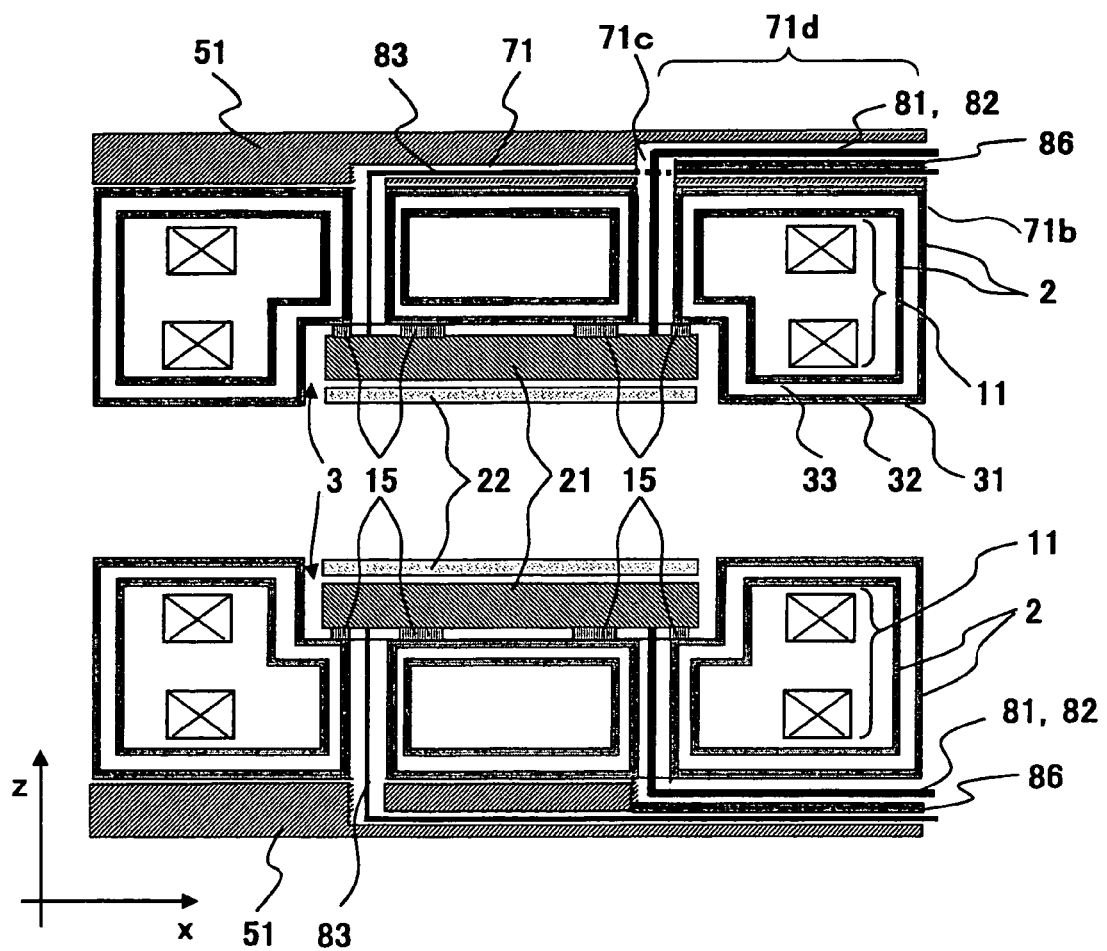
FIG. 10 is a sectional view of a lower part of a lower superconducting magnet 101b of the MRI apparatus according to the sixth embodiment.

The MRI apparatus of the sixth embodiment will be explained by referring to FIGS. 9, 10 and 11. In the MRI apparatus of the sixth embodiment, as shown in FIG. 9, at least three through-holes 4 are provided in the cryostat 2, and three through-holes 71 connected with the three through-holes 4, respectively, are provided in the thick plate reinforcing member 51. These three through-holes 71 join on the way at a meeting 71c in the thick plate reinforcing member 51 to form a one through-hole 71d of a large diameter. An opening 71b of the through-hole 71d of a large diameter is provided at the outer peripheral surface of the thick plate reinforcing member 51. Further, inside the through-hole 71d of a large diameter, a plate or cylindrical partition 86 for dividing the interior space into three spaces is disposed.

The cables 81 to the gradient magnetic field coil 21, the cables 82 to the high frequency irradiating coil 22 and the cooling pipe 83 to the gradient magnetic field coil 21 are all drawn into the through-hole 71d of a large diameter in the thick plate reinforcing member 51 from the opening 71b, pass through the three spaces separated by the partition 86, respectively, branch at the confluence 71c into the three through-holes 71, pass through the separate through-holes 4 of the cryostat 2 and drawn into the recess 3. This structure has an advantage that because all of the cables 81 and 82 and the cooling pipe 83 are manageable at one opening 71b, and thus management becomes easy.

Figure 11:
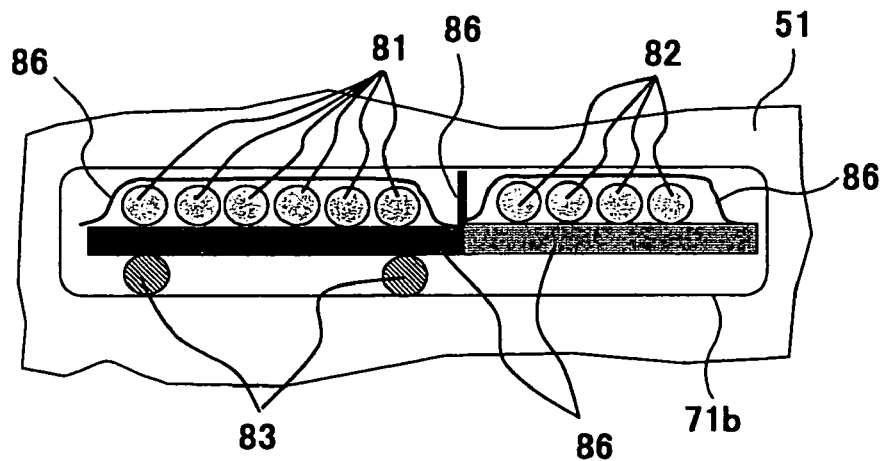
FIG. 11 is a front view of an opening 71b of a plate reinforcing member 51 of the MRI apparatus according to the sixth embodiment.

Further, in this embodiment, as shown in FIG. 11, the cables 81 and the cables 82 pass through two of perpendicularly upper spaces among the three spaces separated by the partition 86, respectively, and the cooling pipe 83 passes through one perpendicularly lower space in the inside of the through-hole 71d of a large diameter. The possibility of wetting of the cables 81 and 82 is thereby eliminated, even if water leakage occurs in the cooling pipe 83.

Furthermore, as shown in FIG. 11, the cooling pipe 83 is disposed so that it should pass through the space under the cables 81 to the gradient magnetic field coil 21. By disposing the cooling pipe 83 as described above, the Joule heat generated by the cable 81, in which a large current flows, can be eliminated by the cooling pipe 83. In addition, as for the structure of the cables 81, by wiring six electric supplying cables to X, Y and Z coils of the gradient magnetic field coil 21 in rows as shown in FIG. 11, not wiring them as a bunch, cooling efficiency can be enhanced. By using a metal having a high thermal conductivity such as copper and aluminum as the material of the partition 86, cooling efficiency can be increased. Because this partition 86 acts also as a magnetic shield, an effect of preventing influence of the induction electromagnetic waves generated by the cables 81 to the gradient magnetic field coil 21 on the cables 82 can also be obtained.

Seventh Embodiment

Figure 12:
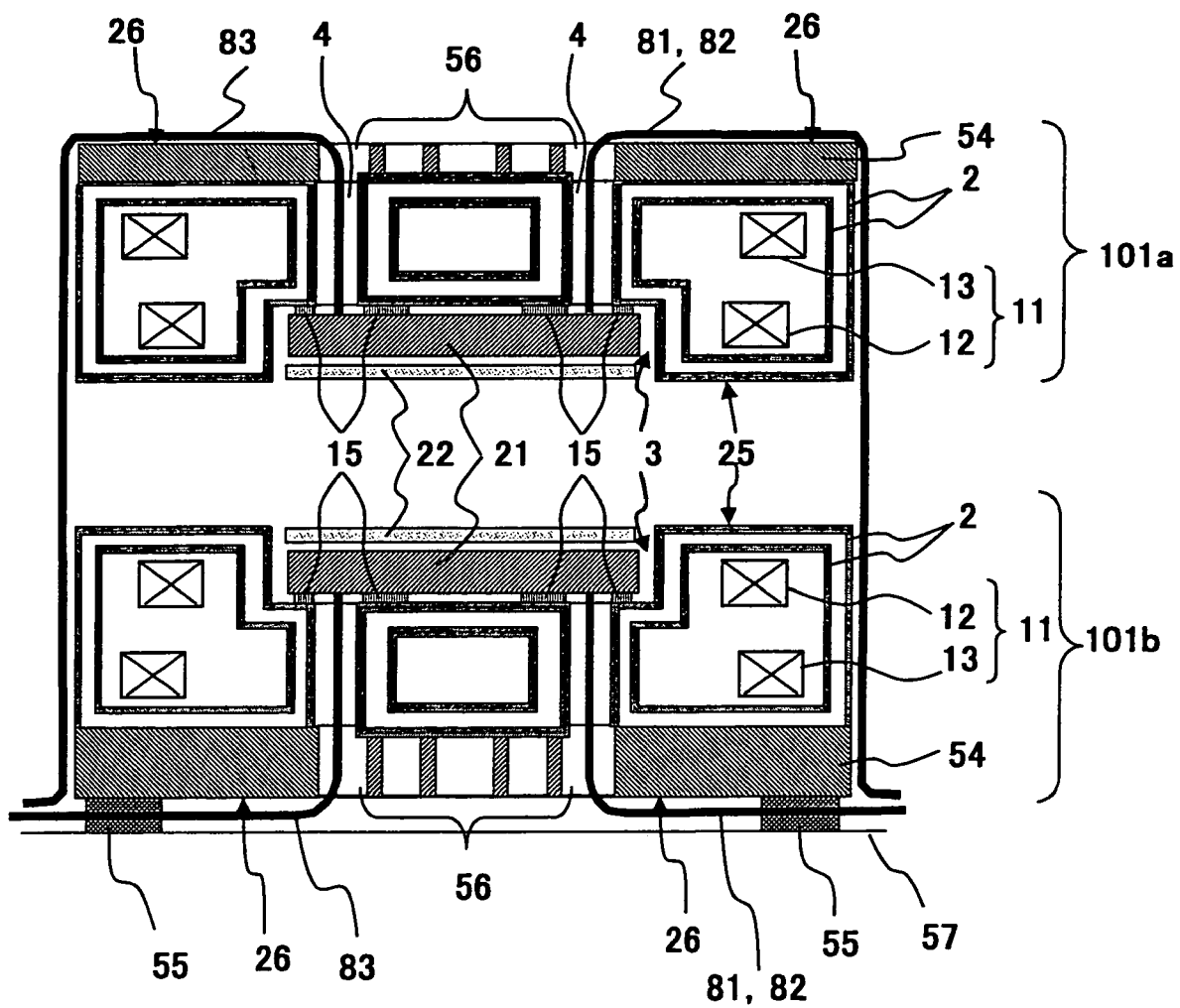
FIG. 12 is a sectional view of a static magnetic field generating apparatus 1 of the MRI apparatus according to the seventh embodiment.

The MRI apparatus of the seventh embodiment will be explained by referring to FIG. 12. In the MRI apparatus of the seventh embodiment, as shown in FIG. 12, the wall (bottom) of the non-opposing face 26 of the cryostat 2 is thickened to integrally form the thick plate reinforcing member 54. This thick plate reinforcing member 54 is disposed only for a region of doughnut shape on the peripheral side from the through-hole 4. In a region on the center side from the through-hole 4, a grid reinforcing member 56 is disposed. The rigidity of the non-opposing face 26 of the cryostat 2 is thereby increased in spite of the structure that can be easily manufactured. In the structure shown in FIG. 12, the connecting column 6 is omitted.

The grid reinforcing member 56 is disposed so that the positions of openings should correspond to the positions of the through-holes 4. The cables 81 and 82 and the cooling pipe 83 pass through the openings of the grid reinforcing member 54 and the through-holes 4 and drawn into the recess 3. Further, as shown in FIG. 12, by disposing legs 55 under the lower superconducting magnet 101b to provide a space with respect to the floor 57, it can be made easy to draw the cables 81 and 82 to the lower superconducting magnet 101b and the cooling pipe 83 to the outer peripheral surface.

In the first to seventh embodiments described above, the same reinforcing structure for the cryostat 2 is used for the upper superconducting magnet 101a and the lower superconducting magnet 101b. However, because the responses of the upper and lower superconducting magnets 101a and 101b to vibration of course differ, different reinforcing structures may also be used for the upper and lower superconducting magnets 101a and 101b. For example, the grid reinforcing member 52 may be employed for the upper side, and the plate reinforcing member 51 may be employed for the lower side. Further, it is also possible to use different sizes or materials of the reinforcing members for the upper and lower superconducting magnets 101a and 101b. If a heavy load is placed on the superconducting magnet 101a, resonance at a low frequency generally becomes likely to occur. Therefore, as in the embodiment shown in FIG. 12, a smaller thickness of the thick plate reinforcing member 51 can be used for the upper superconducting magnet 101a compared with that for the lower superconducting magnet 101b.

Further, in the first to seventh embodiments, the gradient magnetic field coil 21 is fixed to the cryostat 2 with the fixing part 15. However, the cryostat 2 and the gradient magnetic field coil 21 can be firmly fixed into one body by using the structures shown in the eleventh to fourteenth embodiments mentioned later. The rigidity of the cryostat 2 and the gradient magnetic field coil 21 as a whole is thereby improved, and therefore vibration of the cryostat 2 and the gradient magnetic field coil 21 as a whole can be reduced.

Furthermore, the structures which will be shown in the eighth to tenth embodiments may be used for the first to seventh embodiments as a structure of connecting the gradient magnetic field coil 21 and the cables 8 or a structure of connecting the gradient magnetic field coil 21 and the cooling pipe 83. The gradient magnetic field coil and the cables 8 or the cooling pipe 63 can be thereby easily connected, and thus manufacturing efficiency and efficiency of maintenance operation can be improved.

Eighth Embodiment

Figure 13:
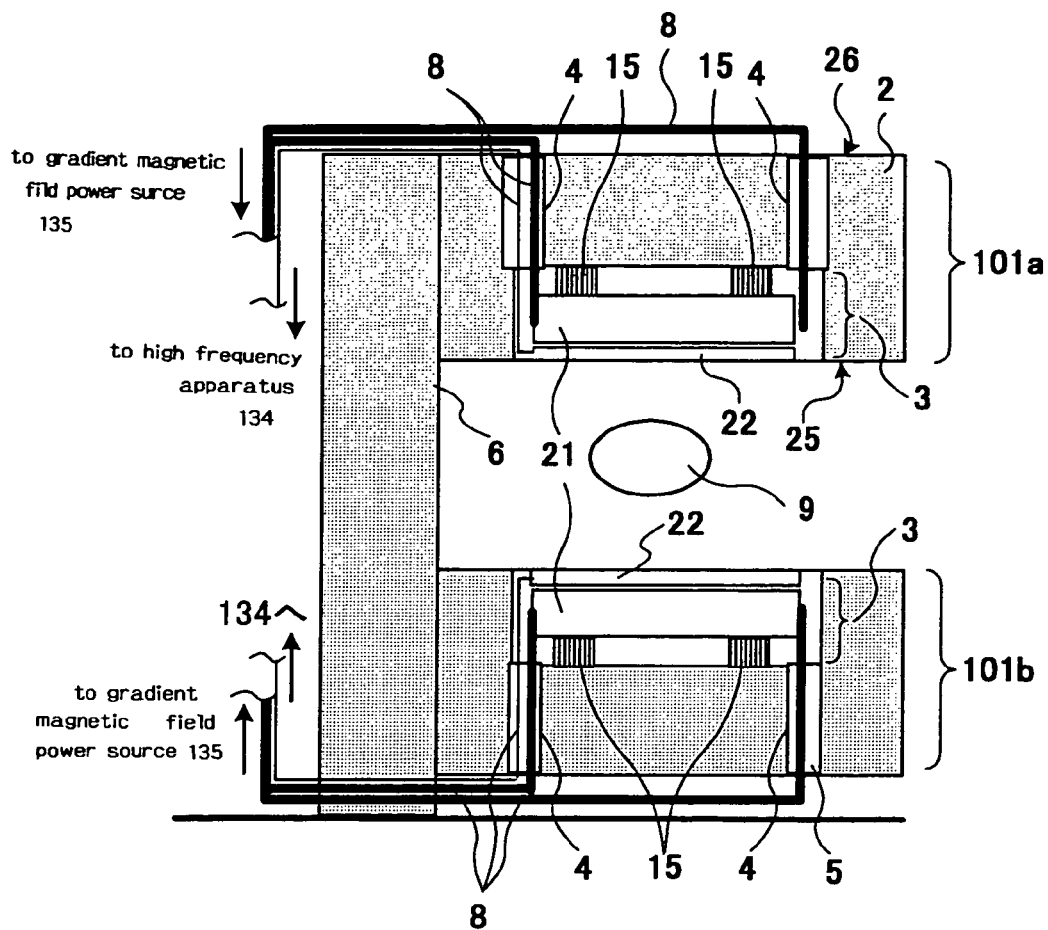
FIG. 13 is a sectional view showing a static magnetic field generating apparatus of the magnetic resonance imaging apparatus of the eighth embodiment.

Hereafter, the eighth embodiment of the present invention will be explained on the basis of FIG. 13. The MRI apparatus of the eighth embodiment has the same configuration as that of the first embodiment except that the superconducting magnets 101a and 101b are not provided with the thick plate reinforcing members 51 and 54 and the grid reinforcing members 52 and 56.

In the cryostat 2 for each of the superconducting magnets 101a and 101b, at least one or more of through-holes 4 (in FIG. 13, two through-holes are provided on each of both sides) are provided at a position(s) near the side of the recess 3 at the center, i.e., near the side of the gradient magnetic field coil 21, connecting the opposing face 25 and the non-opposing face 26. The cross-sectional shape of the through-hole 4 may be any one of circle, quadrangle, ellipse etc.

Figure 14:
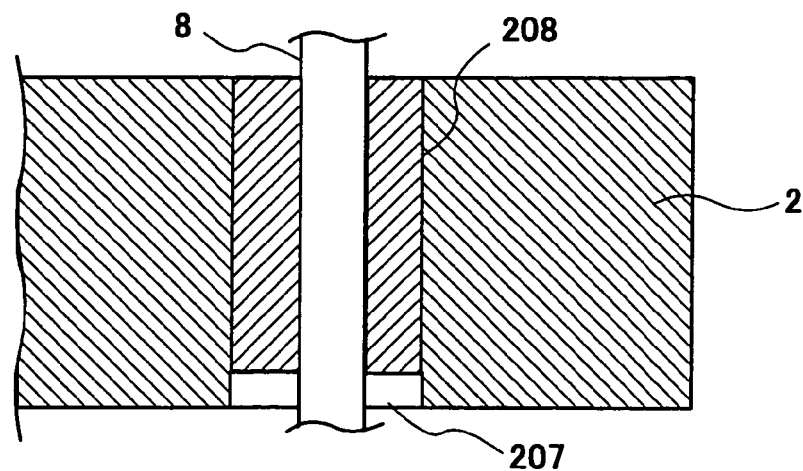
FIG. 14 is a sectional view-showing a fixation structure (fixing agent type) of a cable according to the eighth embodiment.

As shown in FIG. 14, the cables 8 for the gradient magnetic field coil 21 and the high frequency magnetic field coil 22 are fixed to the through-hole 4. That is, at the time of forming the superconducting magnets 101a and 101b, the cables 8 are fixed in the through-hole 4 by passing them through the through-hole 4, providing a plug 207 for reserving liquid at a lower position of the hole, pouring a fixing agent 208 (for example, resin, foaming agent) from the top and curing the agent. The plug 207 for reserving liquid may be made of a polymer material such as resin or silicone rubber, and a highly airtight material is preferred.

Figure 15:
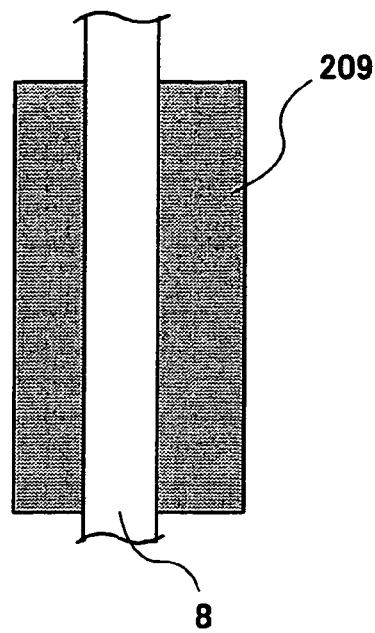
FIG. 15 is a sectional view showing a fixation structure (cushioning type) of a cable according to the eighth embodiment.

Further, as shown in FIG. 15, the cables 8 may be fixed in a cushioning material 209 (for example, cork, shock absorber), of which outer shape is manufactured beforehand so as to fit the hole shape of the through-hole 4, and inserted into the through-hole 4. The cushioning material 209 can be fixed in the through-hole 4 by applying an adhesive to the outer surface of the cushioning material 209 beforehand, or pouring an adhesive after inserting it into the through-hole 4.

Figure 16:
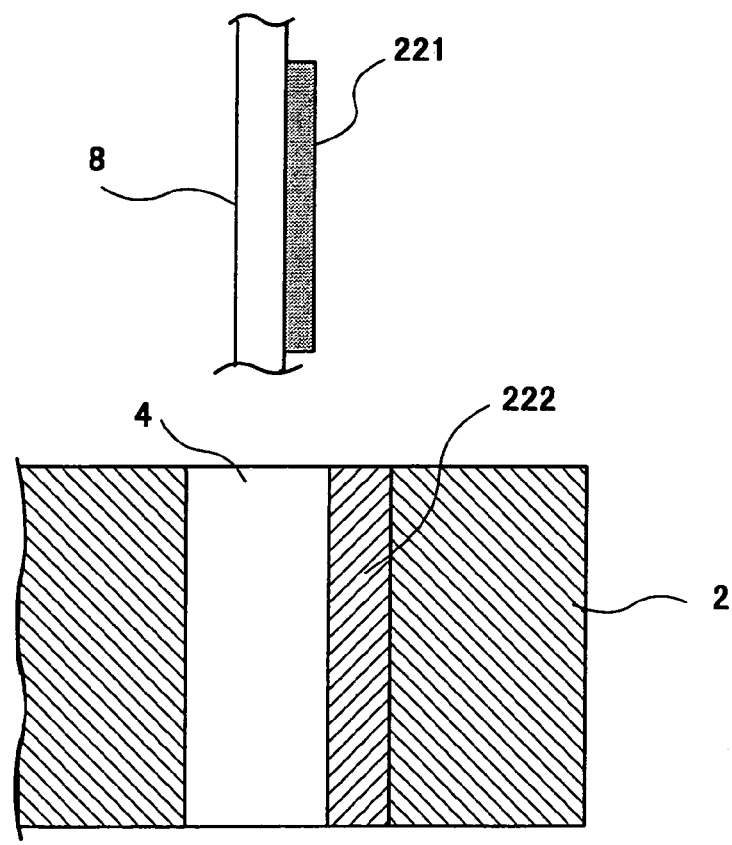
FIG. 16 is a sectional view showing a fixation structure (guide rail type) of a cable according to the eighth embodiment.

Further, as shown in FIG. 16, a rod-like guide 221 can be fixed to the cables 8, and a rail 222 for leading the guide 221 can be attached in the through-hole 4. The guide 221 to which the cables 8 are fixed may be lead along the rail 222 and fixed at a predetermined position.

Figure 17:
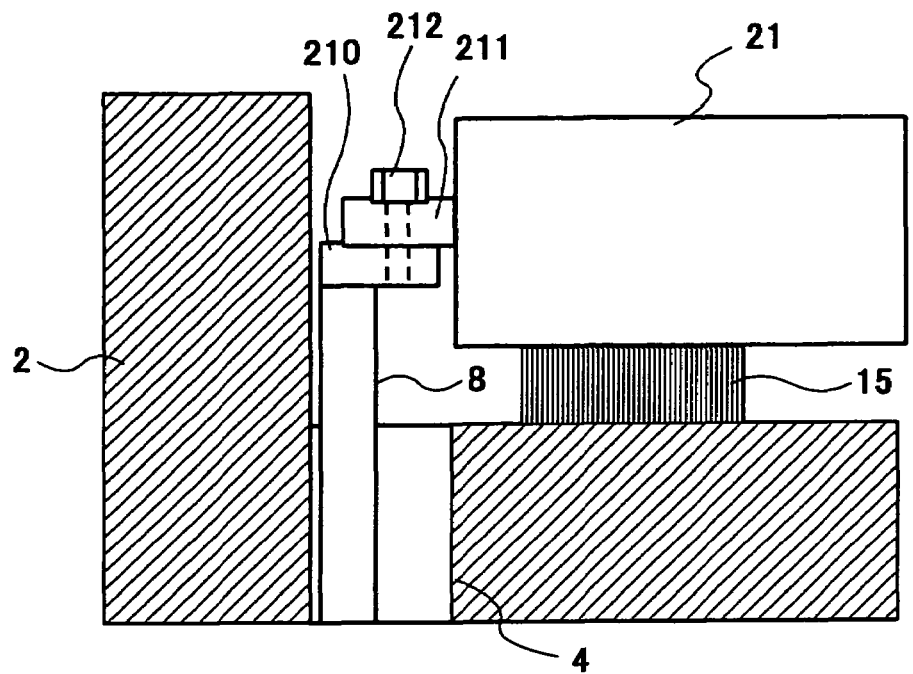
FIG. 17 is a sectional view showing a terminal connecting structure according to the eighth embodiment.
Figure 18:
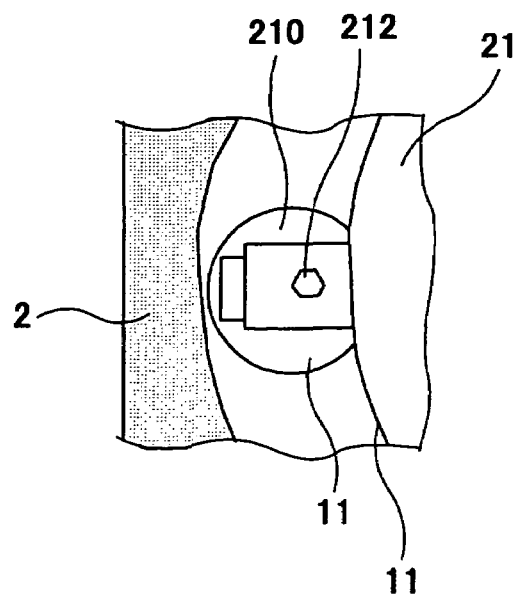
FIG. 18 is a top view of the terminal connecting structure according to the eighth embodiment shown in FIG. 17.

As shown in FIG. 17, the cables 8 are connected to a current receiving terminal 211 attached to the gradient magnetic field coil 21. FIG. 18 is a view from top of the part shown in FIG. 17. At the end of each cable 8, a current supplying terminal 210 is attached. The terminal 211 is a current receiving terminal coming from the gradient magnetic field coil. By mounting the gradient magnetic field coil 21 on the cryostat 2 from the top so that the current receiving terminal 211 should be superimposed on the current supplying terminal 210 and fastening the terminals 210 and 211 with a bolt 212, the gradient magnetic field coil 21 and the cable 8 can be connected. Thus, the fastening position can be accessed from a position above the recess 3 and therefore observed with good visibility, and operation for the fastening with the bolt can be easily performed. Further, because the cable 8 and the gradient magnetic field coil 21 can be separated only by removing the bolt 212, the gradient magnetic field coil 21 can also be easily removed.

Figure 19:
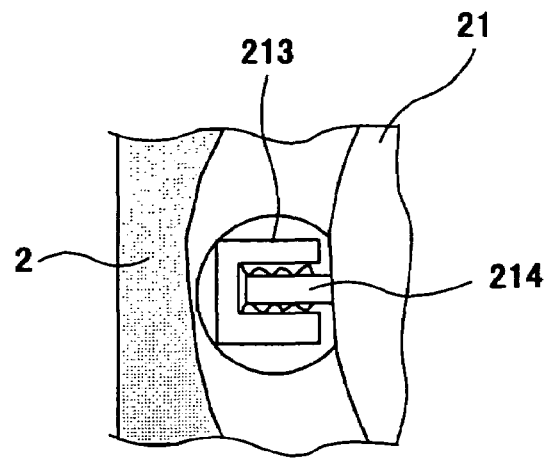
FIG. 19 is a top view of a terminal connecting structure according to the eighth embodiment.

Further, the terminals 210 and 211 may be electrically contacted by using a connector, without fastening them with the bolt 212 as shown in FIG. 17. An example is shown in FIG. 19, in which a connector 213 is used as the current supplying terminal 210, and a connector 214 is used as the current receiving terminal 211. As the connectors 213 and 214, for example, the product of Multi-Contact having a trade name of "Fork plug" can be used.

Although the eighth embodiment is as described above, another configuration can be employed, in which the cables 8 are attached to the gradient magnetic field coil 21 beforehand, and when attaching the gradient magnetic field coil 21 to the superconducting magnet 101a or 101b, the cables 8 are fixed to the through-hole 4. In this case, when the gradient magnetic field coil 21 is attached to the cryostat 2, the cables 8 attached to the gradient magnetic field coil 21 are passed through the through-hole 4. A manner therefor would be, for example, that a member serving as the guide 221 in the shape of rod or the like is temporarily fixed to the cables 8 and the guide 221 is passed along the rail 222 provided in the through-hole 4. Then, the plug 207 for reserving liquid is disposed at a lower part of the through-hole 4, and the fixing agent 208 is poured from above and cured.

Alternatively, it is also possible to pass only the guide 221 through the through-hole 4 without using the rail 222, dispose the plug 207 for reserving liquid at a lower position of the through-hole 4, pour a fixing agent 208 from the top and cure the agent. Further, it is also possible to temporarily fix the cables 8 at the end of the guide 221 and after used as a guide at the time of passing the cables through the through-hole 4, remove the guide 221.

In the eighth embodiment, the wall of the through-hole 4 provided in the cryostat 2 acts as a column, and the rigidity of the cryostat 2 as a whole can be thereby improved. Thus, vibration of the superconducting magnets 101a and 101b can be reduced. Further, because the space between the cables 8 and the wall surface of the through-hole 4 is filled with the cushioning material 209 or fixing agent 208 to fix the cables 8, transmission of vibration of the gradient magnetic field coil 21 to the superconducting magnet 101a or 101b via the cables 8 can be reduced. There can be a further advantage that when the cables 8 are passed through the through-hole 4, the connection operation becomes easy by using the terminals 210, 211 and so forth.

In addition, it is of course also possible to fix any one of the thick plate reinforcing members 51 and 54 and grid reinforcing members 52 and 56 described in the first to seventh embodiments to the cryostat 2. In such a case, because the rigidity of the cryostat 2 can be further improved, vibration of the superconducting magnets 101a and 101b can be further reduced.

Ninth Embodiment

Hereafter, the ninth embodiment of the present invention will be explained on the basis of FIG. 20. Also in this embodiment, the superconducting magnets 101a and 101b are not provided with the thick plate reinforcing member 51 and so forth and the grid reinforcing member 52 and so forth as in the eighth embodiment.

Figure 20:
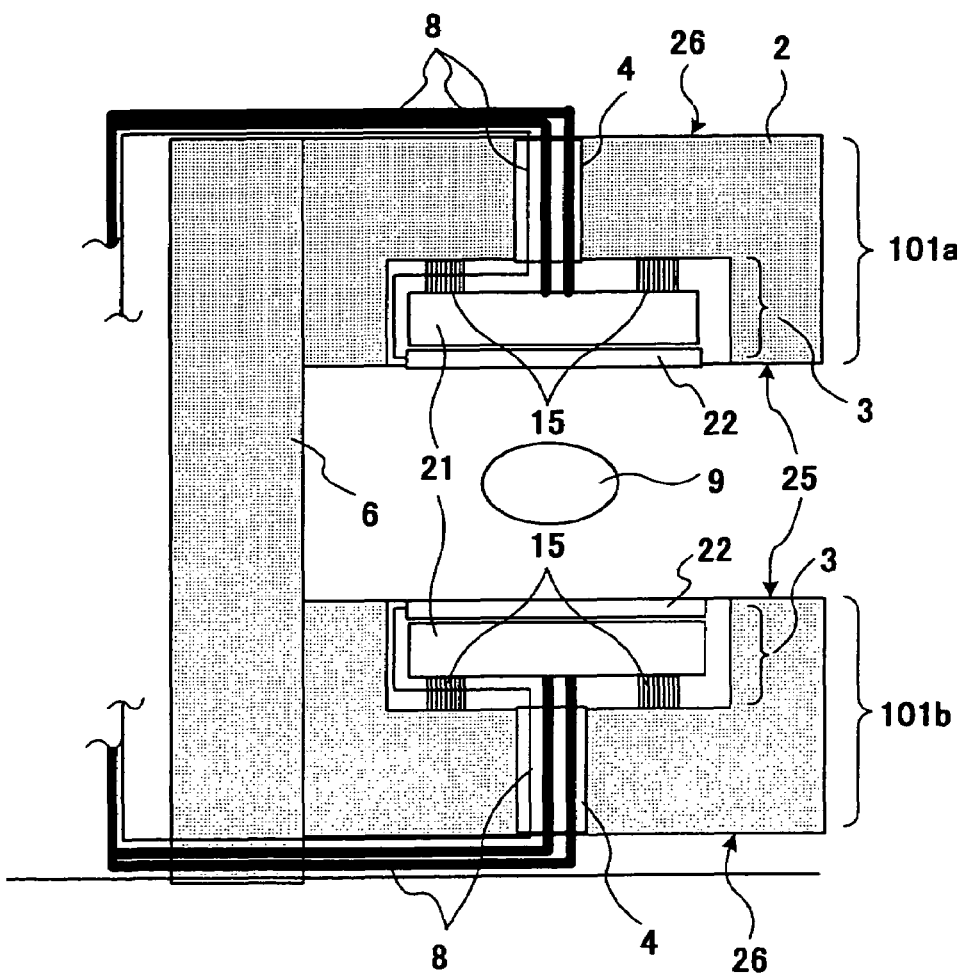
FIG. 20 is a sectional view of a static magnetic field generating apparatus of the magnetic resonance imaging apparatus according to the ninth embodiment.

In the cryostat 2 of the superconducting magnet 101a or 101b shown in FIG. 20, at least one through-hole 4 (in FIG. 20, one through-hole is provided) is provided, which connects the opposing face 25 and the non-opposing face 26 at the center of the central portion of the recess 3. The configuration other than the connection terminals is the same as that of the structure shown in FIG. 13 according to the eighth embodiment.

Figure 21:
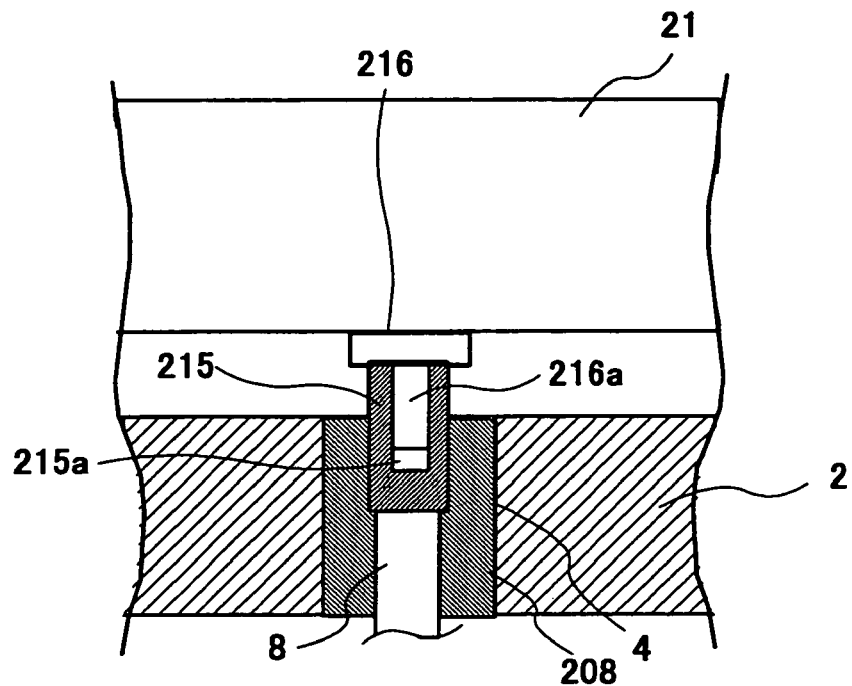
FIG. 21 is a sectional view showing a terminal connecting structure according to the ninth embodiment.

A connecting structure for the cables 8 and the gradient magnetic field coil 21 according to this embodiment is shown in FIG. 21. A terminal 215 is a current supplying terminal attached to the end of each cable 8, and it has a hollow 215a. Although this hollow 215a has a circular cross-section in this example, it does not need to be circular, and it may have a polygonal shape. A terminal 216 is a current receiving terminal attached to the gradient magnetic field coil 21, and has a projection 216a to be inserted into the circular hollow 215a of the terminal 215. By inserting the projection 216a of the current receiving terminal 216 into the hollow 215a of the current supplying terminal 215, the gradient magnetic field coil 21 can be connected to the cable 8. By using such a structure, the cables 8 can be connected to the central part of the superconducting magnet 101a or 101b, and removal thereof also becomes easy. As such a terminal structure, for example, the products of Multi-Contact having trade names of "B10N Socket" and "S10N Plug" can be used. Furthermore, a detachable and attachable connector of lock-type (for example, the products of Multiple Connector having trade names of "B10AR-N Socket" and "S10AR-N Plug") or such a connecter as shown in FIG. 19 that can be perpendicularly connected may also be used.

Figure 22:
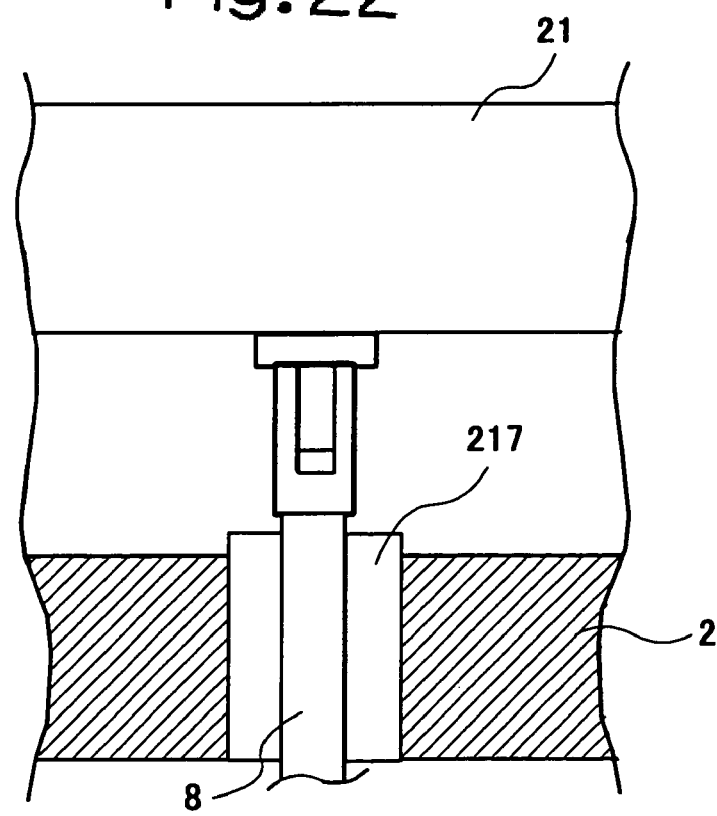
FIG. 22 is a sectional view showing a terminal connecting structure according to the ninth embodiment.

As another example of the ninth embodiment, the cables 8 may be attached to the gradient magnetic field coil 21 in advance, and when attaching the gradient magnetic field coil 21 to the superconducting magnet 101a or 101b, the cables 8 are fixed to the through-hole 4. In this case, the cables 8 attached to the gradient magnetic field coil 21 beforehand are passed through the through-hole 4 when the gradient magnetic field coil 21 is attached to the superconducting magnet 101a or 101b. A manner therefor may be to fix the cushioning material 217 manufactured beforehand into an outer shape corresponding to the inner shape of the through-hole 4 to the cables 8, and to insert the cushioning material 217 into the through-hole 4 as shown in FIG. 22. The cushioning material 217 can be fixed in the through-hole 4 with an adhesive applied beforehand to the outer surface of the cushioning material 217.

The connection of the cables 8 to the gradient magnetic field coil 21 was explained above. Connection of the cables 8 with the high frequency magnetic field coil 22 or a shim coil can also be attained in a similar manner. In such a case, a plurality of through-holes 4 may be provided, and individual cables 8 or grouped cables 8 may be passed through the through-holes 4, respectively. Alternatively, all the required cables 8 can be bundled and fixed in the through-hole 4 as one bunch.

Tenth Embodiment

Hereafter, a connecting structure of a piping 2208 for supplying a refrigerant for cooling the gradient magnetic field coil 21 will be explained as the tenth embodiment by referring to FIG. 23. This structure can be used independently or in combination with the connecting structures of the cables 8 explained in the eighth and ninth embodiments.

Figure 23:
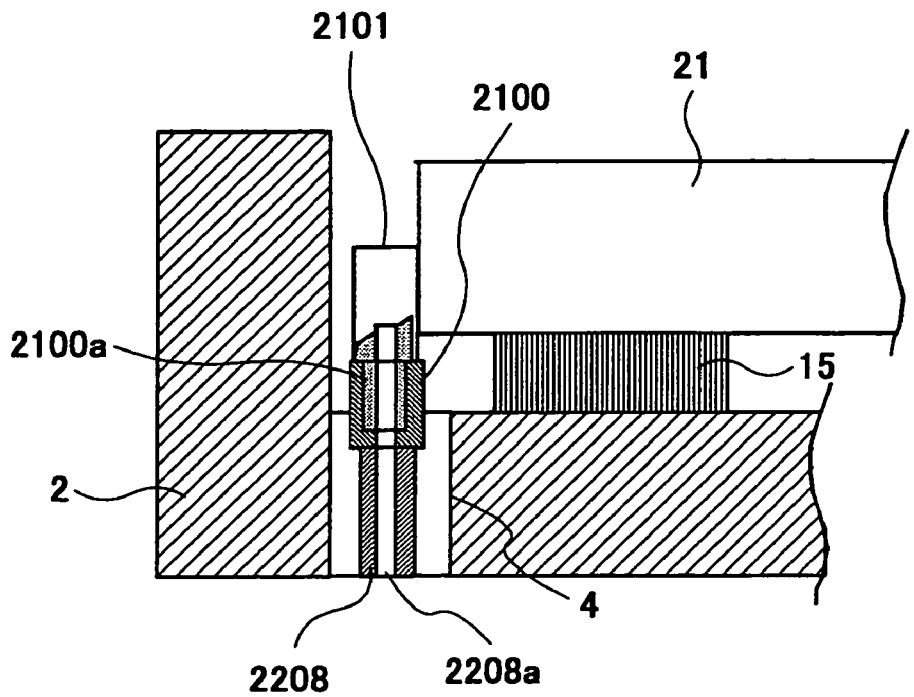
FIG. 23 is a sectional view showing a terminal connecting structure of piping according to the tenth embodiment.

A structure for connecting the piping 2208 and the gradient magnetic field coil 21 with terminals 2101 and 2100 at a lateral position of the gradient magnetic field coil 21 is shown in FIG. 23. The terminal 2100 is a refrigerant supplying terminal attached to the end of the piping 2208, and the terminal 2101 is a refrigerant receiving terminal attached to the gradient magnetic field coil 21.

Figure 24:
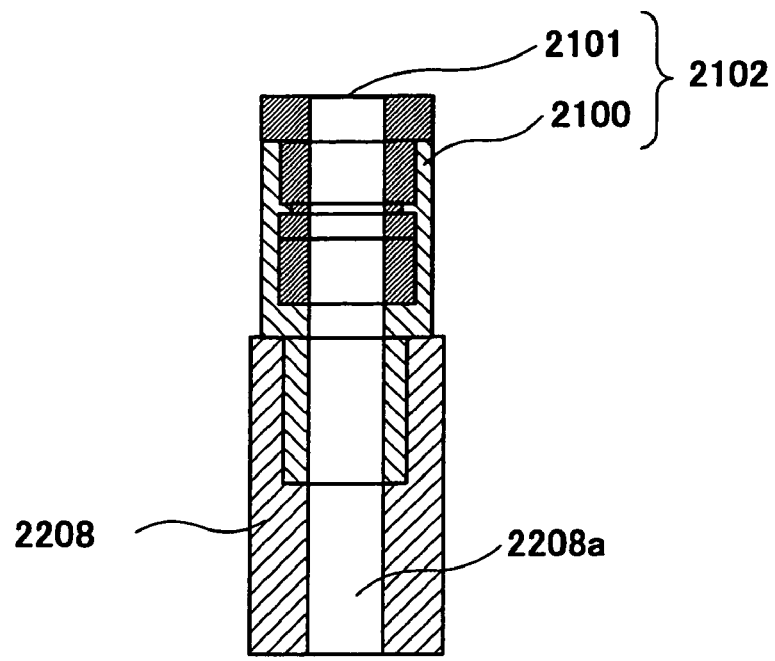
FIG. 24 is a sectional view showing a connecting structure of piping using a lock type connector according to the tenth embodiment.

A hollow through-hole 2208a is provided in the piping 2208 and the terminals 2100 and 2101. The cross-sections of the piping 2208 and the terminals 2100 and 2101 may have a quadrangular or circular shape. An end projection 2100a of the refrigerant supplying terminal 2100 is inserted into a hollow 2100a provided in the refrigerant receiving terminal 2101. By using a detachable and attachable lock type connector 2102 as shown in FIG. 24 as these terminals 2100 and 2101, a detachable and attachable structure can be obtained.

Figure 25:
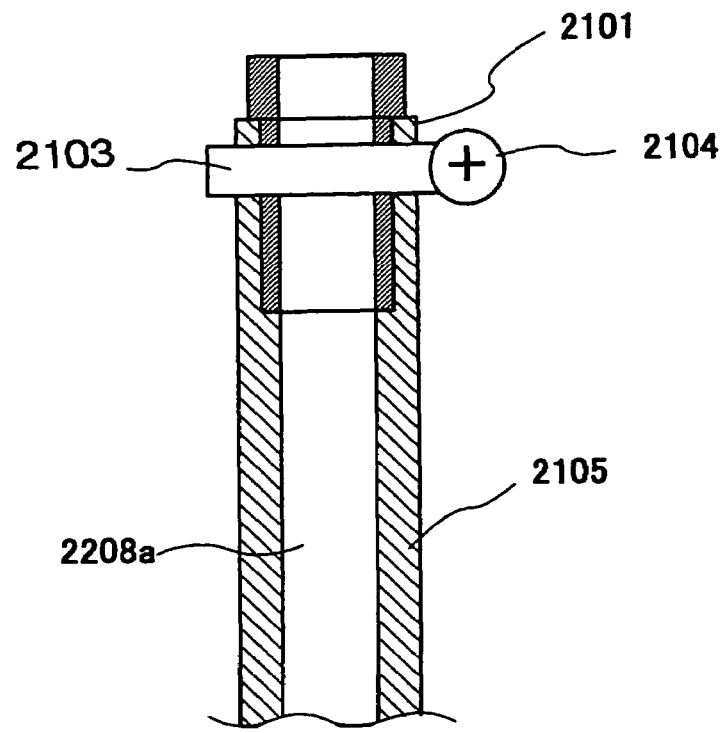
FIG. 25 is a sectional view showing a connecting structure of piping using a rubber tube according to the tenth embodiment.

Alternatively, as shown in FIG. 25, when a rubber tube 2105 is used as the piping 2208, the refrigerant supplying terminal 2100 may be omitted, and the piping 2208 may be fixed by constricting a fixing band 2103 with a screw 2104. As an example of such terminal 2101 and band 2103, the product of Staubli having a trade name of "Quick Release Coupling" can be used.

Figure 26:
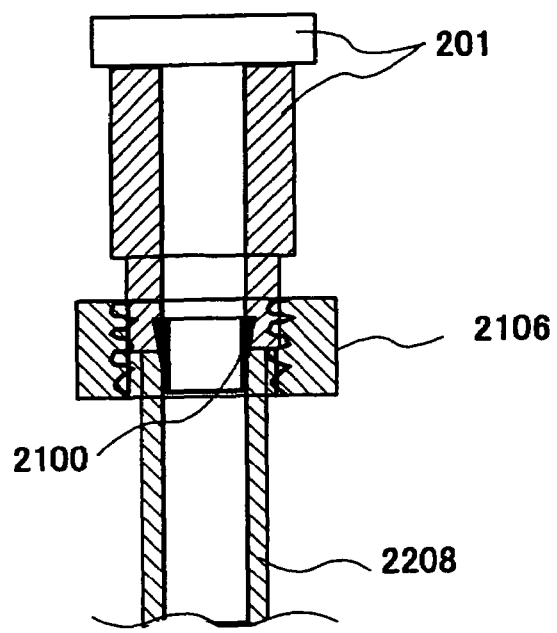
FIG. 26 shows a connecting structure of piping using a connector according to the tenth embodiment.

Further, when the refrigerant supplying terminal 2100 and the refrigerant receiving terminal 2101 made of a nonmagnetic metallic substance (brass, stainless steel etc.) are used, the both may be fixed by brazing. Alternatively, the connector of Swagelok may be used, with which the piping 2208 and the terminals 2100 and 2101 are fixed by rotating a nut 2106 as shown in FIG. 26.

By using such a configuration as described above, the gradient magnetic field coil 21 can be cooled by cooling the refrigerant outside the gradient magnetic field coil 21 and circulating the refrigerant (liquid or gas) in the piping 2208. Furthermore, when the piping 2208 and terminals 2100 and 2101 made of a conductive material are used, the electric current from the gradient magnetic field power source 135 can be supplied to the piping 2208 also having the function of the cables 8 to supply electric power to the gradient magnetic field coil 21.

Figure 27:
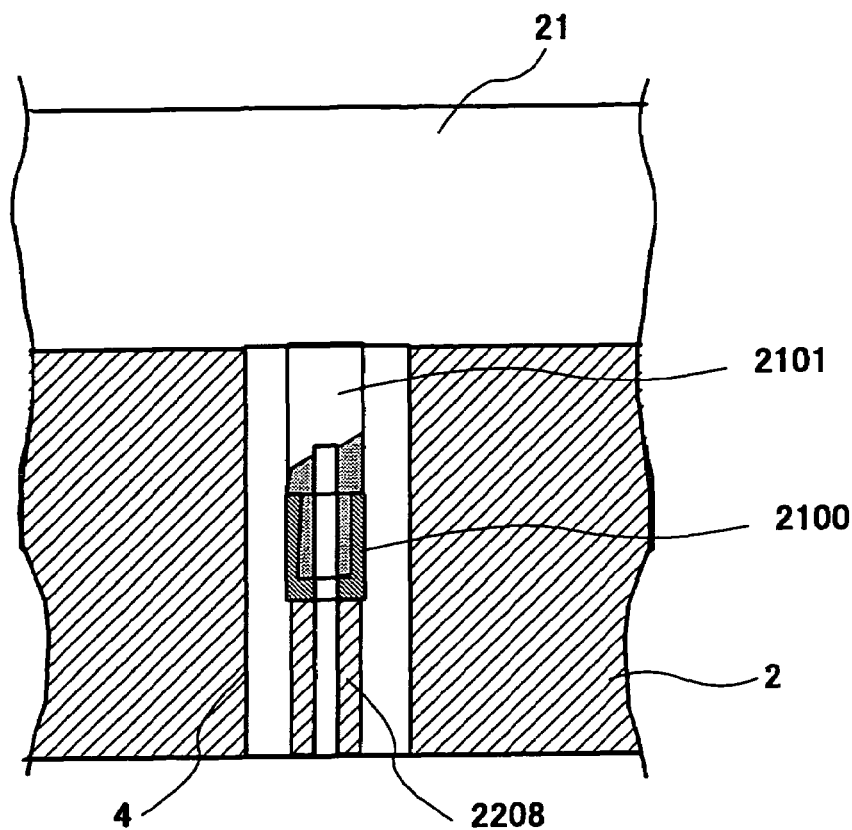
FIG. 27 is a sectional view showing a structure connecting piping at an approximate center of a recess 3 according to the tenth embodiment.

The structure for connecting the piping 2208 at a lateral position of the gradient magnetic field coil 21 was explained above. However, the structure can also be applied to connection at a central position of the gradient magnetic field coil 21 as shown in FIG. 27.

According to the eighth to tenth embodiments, connection of cables 8 for supplying electric currents to the gradient magnetic field coil, high frequency magnetic field coil and shim coil and receiving echo signals and fixation and connection of piping for supplying a refrigerant for cooling the gradient magnetic field coil can be easily attained without degrading open feeling in an MRI apparatus. In addition, the gradient magnetic field coil, high frequency magnetic field coil and shim coil can be easily detached and attached during maintenance operations.

Further, because the through-hole 4 prepared in the cryostat 2 of the superconducting magnet 101a or 101b acts as a column, rigidity of the cryostat 2 can be enhanced, and therefore vibration of superconducting magnet 101a or 101b due to vibration of the gradient magnetic field coil 21 can be suppressed. Moreover, by fixing the cables 8 and piping 2208 to the inner wall surface of the through-hole 4 with a cushioning material 217 or fixing agent 208, transmission of vibration of the gradient magnetic field coil 21 to the superconducting magnet 101a or 101b via the cables 8 and the piping 2208 can be reduced. Thus, vibration of the superconducting magnets 101a and 101b can be reduced.

In addition to the configurations of the eighth to tenth embodiments, a structure reinforcing member such as the thick plate reinforcing members 51 and 54 and the grid reinforcing members 52 and 56 of the first to seventh embodiments may of course be also fixed. In this case, the rigidity of the cryostat 2 can be further enhanced, and therefore vibration of the superconducting magnets 101a and 101b can be further reduced.

Eleventh Embodiment

In the eleventh embodiment, the gradient magnetic field coil 21 is firmly fixed on the superconducting magnet 101a or 101b having the rigidity-enhancing structure and rigidly formed to reduce the vibration amplitude of the gradient magnetic field coil 21. As a result, the vibration amplitude of the superconducting magnets 101a and 101b is also reduced. At the same time, generation of noise caused by the vibration is also suppressed. Although the structure of the superconducting magnets 101a and 101b is the same as that of the first embodiment, the thick plate reinforcing member 51 and so forth are not provided.

Figure 28:
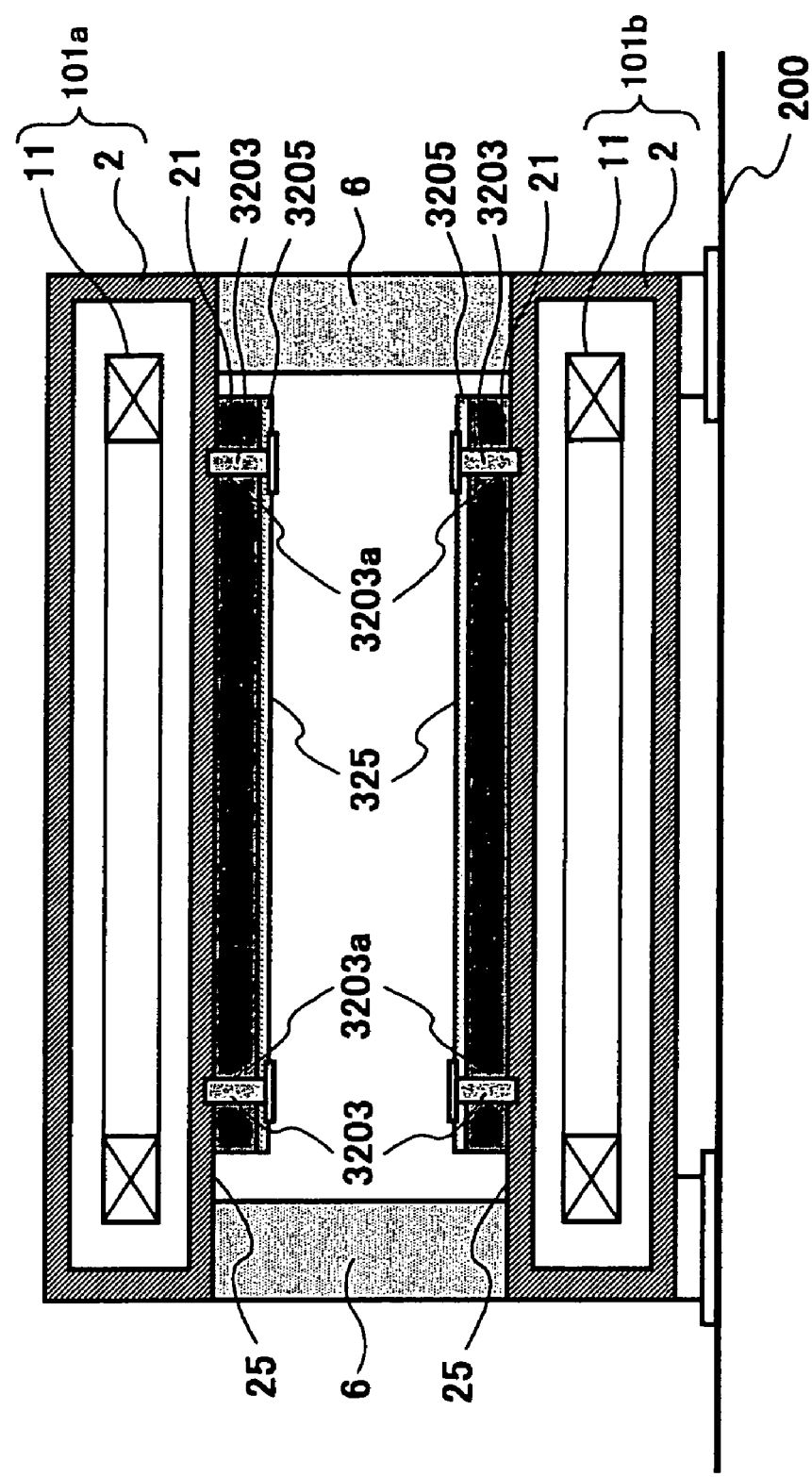
FIG. 28 is a sectional view of a static magnetic field generating apparatus according to the eleventh embodiment.

The eleventh embodiment will be explained by referring to FIG. 28. The gradient magnetic field coil 21 is fixed to the opposing surface 25 of the cryostat of the superconducting magnet 101a or 101b with fixing members 3203. Although the weight of the gradient magnetic field coil 21 considerably changes depending on the structure and material thereof, it is generally comparatively heavy, i.e., as heavy as about 30 to 400 kg. In this embodiment, the vibration amplitude of the gradient magnetic field coil 21 is reduced by firmly fixing the gradient magnetic field coil 21 to the cryostat 2. As a result, the vibration amplitude of the superconducting magnets 101a and 101b is reduced, and generation of noise is also suppressed at the same time.

That is, by firmly fixing the gradient magnetic field coil 21 and the cryostat 2 into one body, the rigidity as a whole can be enhanced compared with the case where they are not integrated. As a result, when the Lorentz force acts at the same level, the vibration amplitude of them can be suppressed to a smaller degree compared with the case where they are not integrated. In addition, in this embodiment, in order to improve the rigidity as a whole, a plate made of a material having a high Young's modulus (for example, glass reinforced epoxy plate etc.) is closely adhered as a gradient magnetic field coil reinforcing member 3205 to the gradient magnetic field coil 21 on the side of the opposing surface 325. For this attachment, adhesion, integral molding of the plate and the gradient magnetic field coil 21 and so forth can be used.

Further, it is desirable to make the wall of the cryostat 2 on the side of the opposing face 25 as thick as the other conditions for design such as strength and uniformity of the magnetic field in the imaging volume (uniform static magnetic field region 9) allow, and a thicker wall improves the total rigidity. Furthermore, although the fixing member 3203 is disposed only for the peripheral portion of the gradient magnetic field coil 21 in FIG. 28, in order to promote the integration, it is desirable to dispose it also at the central portion of the gradient magnetic field coil 21. Alternatively, it is also possible to anchor the gradient magnetic field coil 21 to the cryostat 2 by adhesion.

The fixing member 3203 fixing the gradient magnetic field coil 21 penetrates the gradient magnetic field coil reinforcing member 3205 and the gradient magnetic field coil 21, and is firmly fixed to the cryostat 2. The gradient magnetic field coil reinforcing member 3205 and the gradient magnetic field coil 21 are thereby fixed to the cryostat 2. Through-holes 3203a for passing the fixing member 3203 are provided in the gradient magnetic field coil 21. The through-hole 3203a desirably has such a diameter that the side wall of the through-hole 3203a should not substantially contact with the fixing member 3203. This is because if the fixing member 3203 contacts with the side wall of the through-hole 3203a, fixing condition of the gradient magnetic field coil 21 fluctuates depending on the position or degree of the contact, thus vibration mode differs in every MRI apparatus, and it becomes impossible to obtain stable performance. As the fixing member 3203, a bolt can be used, and in such a case, a tapped hole is provided in the cryostat 2 as the receiving side. When a sufficient thickness for providing the tapped hole cannot be secured for the cryostat 2, a base 3250 having the configuration shown in FIG. 32 mentioned later can be employed.

As described above, the MRI apparatus of the eleventh embodiment can make the vibration amplitude of the gradient magnetic field coil 21 smaller by fixing the gradient magnetic field coil 21 and the cryostat 2 into one body to increase the rigidity of the gradient magnetic field coil 21 and cryostat 2 as a whole. The amplitude of vibration transmitted from the gradient magnetic field coil 21 to the cryostat 2 can be thereby made smaller compared with the case where they are not integrated, and thus vibration of the superconducting magnets 101a and 101b can be suppressed.

In addition to the configuration of the eleventh embodiment, a structure reinforcing member such as the thick plate reinforcing members 51 and 54 and the grid reinforcing members 52 and 56 of the first to seventh embodiments may of course be also fixed. In this case, the rigidity of the cryostat 2 can be further enhanced, and therefore vibration of the superconducting magnets 101a and 101b can be further reduced.

Twelfth Embodiment

Figure 29A:
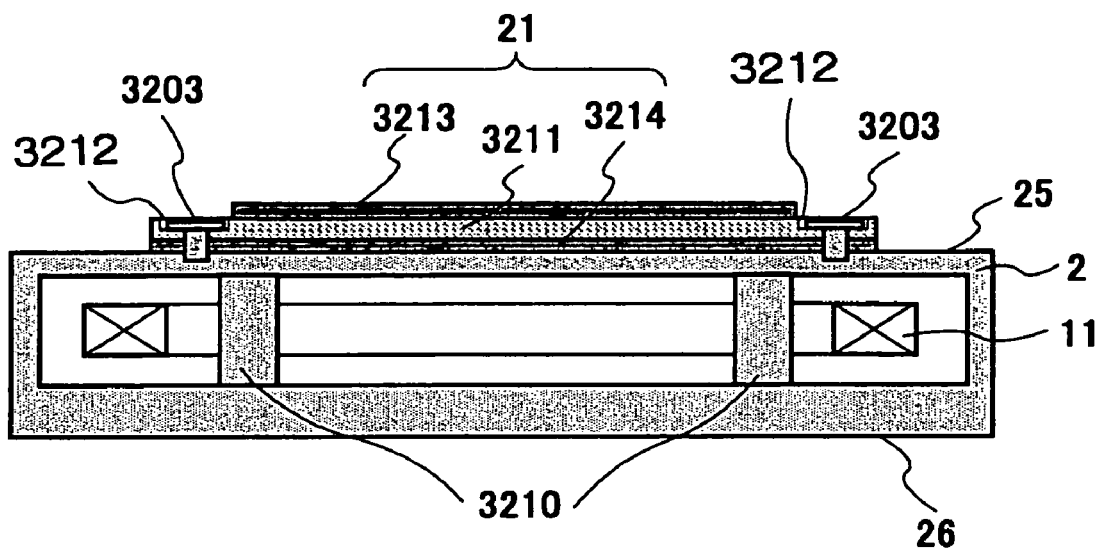
FIG. 29(a) is a sectional view of a lower superconducting magnet 101b according to the twelfth embodiment.
Figure 29B:
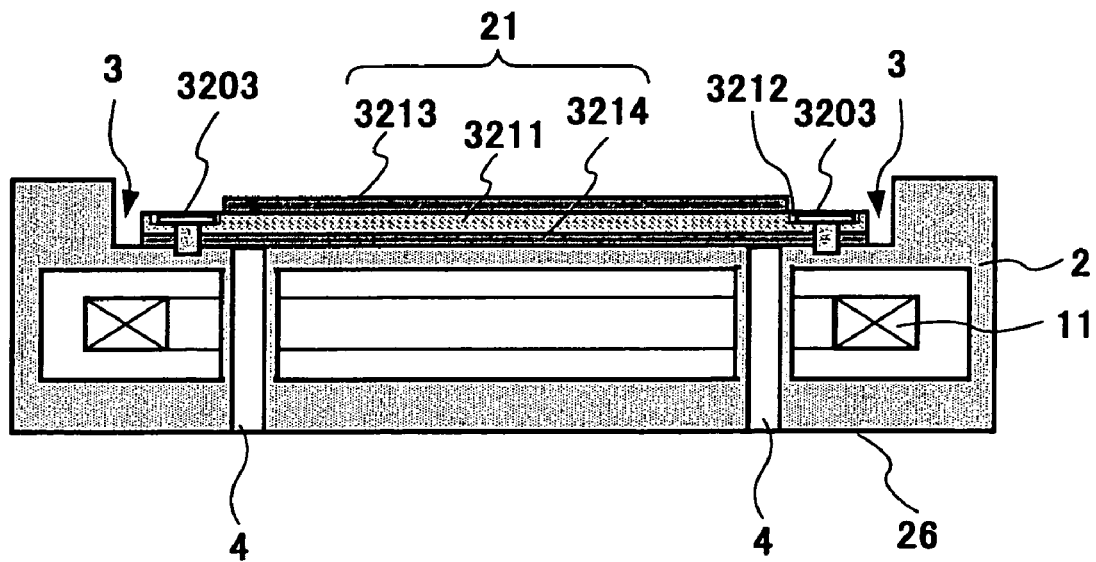
FIG. 29(b) is a sectional view showing a configuration in which a recess 3 and a through-hole 4 are formed in the superconducting magnet 101b shown in FIG. 29(a).

FIGS. 29(*a*) and (*b*) show the MRI apparatus of the present invention according to the twelfth embodiment. Although only the lower superconducting magnet 101b is shown in FIGS. 29(*a*) and (*b*) for simplicity, the upper superconducting magnet 101a also has substantially the same structure, and each component is disposed in a perpendicularly symmetric manner with respect to the horizontal plane at the center of the imaging volume (uniform static magnetic field region 9). In this embodiment, the gradient magnetic field coil 21 comprises, from the imaging space side, a main coil 3213 for generating a gradient magnetic field, an intermediate member 3211 and a shield coil 3214 for preventing leakage of the gradient magnetic field to the outside.

The configuration shown in FIG. 29(*a*) has a structure that, in order to enhance the rigidity of the whole cryostat 2, the wall of the opposing face 25 and the wall of the non-opposing face 26 of the cryostat 2 are firmly linked with cryostat reinforcing members 3210. The reason of this is as follows. That is, because the non-opposing face 26 does not face the uniform static magnetic field region 9 unlike the opposing face 25, there is a dimensional margin to a certain extent, and therefore it is comparatively easy to thicken the wall of the non-opposing face 26. Therefore, by linking the wall of the opposing face 25 with the wall of the non-opposing face 26, of which rigidity is increased by thickening the wall, with the cryostat reinforcing members 3210, the rigidity of the wall on the side of the opposing face 25 can be increased.

Further, in the configuration shown in FIG. 29(*b*), through-holes 4 penetrating the cryostat 2 are provided instead of the reinforcing members 3210 shown in FIG. 29(*a*). Because the side walls of the through-holes 4 link the opposing face 25 and the non-opposing face 26 of the cryostat 2, the rigidity of the wall on the side of the opposing face 25 can be increased as in the configuration shown in FIG. 29(*a*). Further, in the configuration shown in FIG. 29(*b*), because the recess 3 is provided for the opposing face 25, the gradient magnetic field coil 21 can be disposed in the recess 3 and fixed to the cryostat 2. This allows reduction of the thickness of the superconducting magnet 101b so that a wide imaging volume can be maintained.

Further, in the configurations shown in FIGS. 29(*a*) and (*b*), the fixing member 3203 is put into a spot-faced hole 3212 provided in an intermediate material 3211 and fixed to the cryostat 2. The length of the fixing member 3203 can be thereby shortened. The integration of the gradient magnetic field coil 21 and the cryostat 2 can be further improved, and the rigidity of the gradient magnetic field coil 21 and the cryostat 2 can be improved. In the configurations shown in FIGS. 29(*a*) and (*b*), the gradient magnetic field coil 21 has a main coil 3213 and a shield coil 3214, and because the diameter of the main coil 3213 is generally smaller than that of the shield coil 3214, the peripheral portion of the gradient magnetic field coil 21 can be fixed to the cryostat 2 as shown in FIGS. 29(*a*) and (*b*). When the center portion of the gradient magnetic field coil 21 is fixed to the cryostat 2, a long fixing member 3203 can be used as shown in FIG. 28.

Figure 32:
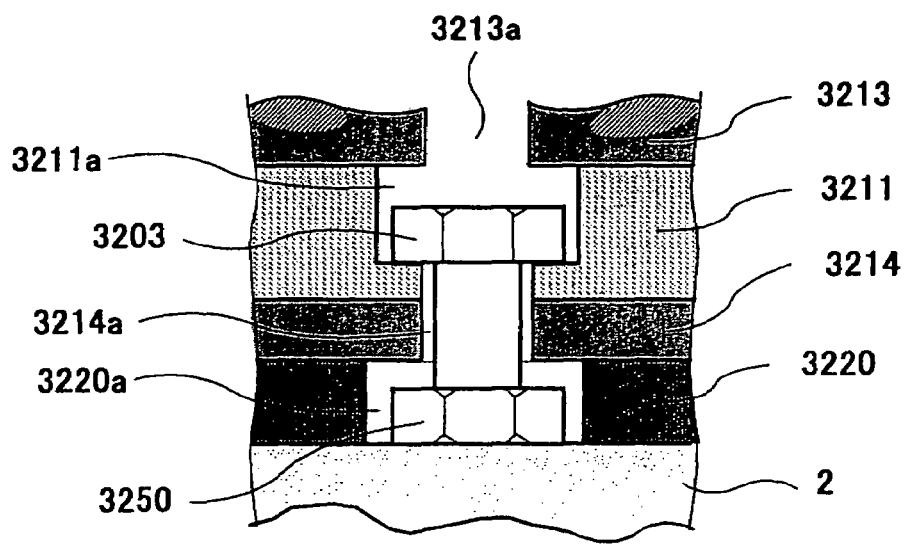
FIG. 32 is a sectional view showing a structure for attaching a base according to the fourteenth embodiment to fix a gradient magnetic field coil with a bolt.

In order to shorten the fixing member 3203 even in the center portion, it is possible to employ the structure shown in FIG. 32. FIG. 32 shows a partial section of the gradient magnetic field coil 21, in which a fixed bolt as the fixing member 3203 is accommodated in the intermediate material 3211. The fixing bolt can be manipulated through a hole 3213a provided in a part of the main coil 3213. When a bolt is used as the fixing member 3203, the wall of the cryostat 2 as the receiving side should have a thickness larger than a certain thickness. If a sufficient wall thickness cannot be secured for the cryostat 2, the base 3250 shown in FIG. 32 mentioned later can be employed.

As described above, in the configurations shown in FIGS. 29(*a*) and (*b*) according to the twelfth embodiment, the gradient magnetic field coil 21 has a three-layer structure, the wall thickness of the non-opposing face 26 of the cryostat 2 is increased, and the cryostat reinforcing member 3210 or the through-hole 4 is further provided, and in addition, the gradient magnetic field coil 21 and the cryostat 2 are integrated by fixation. Thereby, the rigidity of the gradient magnetic field coil 21 and the cryostat 2 as a whole is further increased, and therefore vibration of the superconducting magnets 101*a* and 101*b* can be further reduced. It is not necessary to use all of the structures, the three-layer structure for the gradient magnetic field coil 21, the structure of thickened wall of the non-opposing face 26 of the cryostat, and the structure with the cryostat reinforcing member 3210 or the through-hole 4. One or more of the structures can be used.

In addition to the configuration of the twelfth embodiment, a structure reinforcing member such as the thick plate reinforcing members 51 and 54 and the grid reinforcing members 52 and 56 of the first to seventh embodiments may of course be also fixed. In this case, the rigidity of the cryostat 2 can be further enhanced, and therefore vibration of the superconducting magnets 101*a* and 101*b* can be further reduced.

Thirteenth Embodiment

Figure 30:
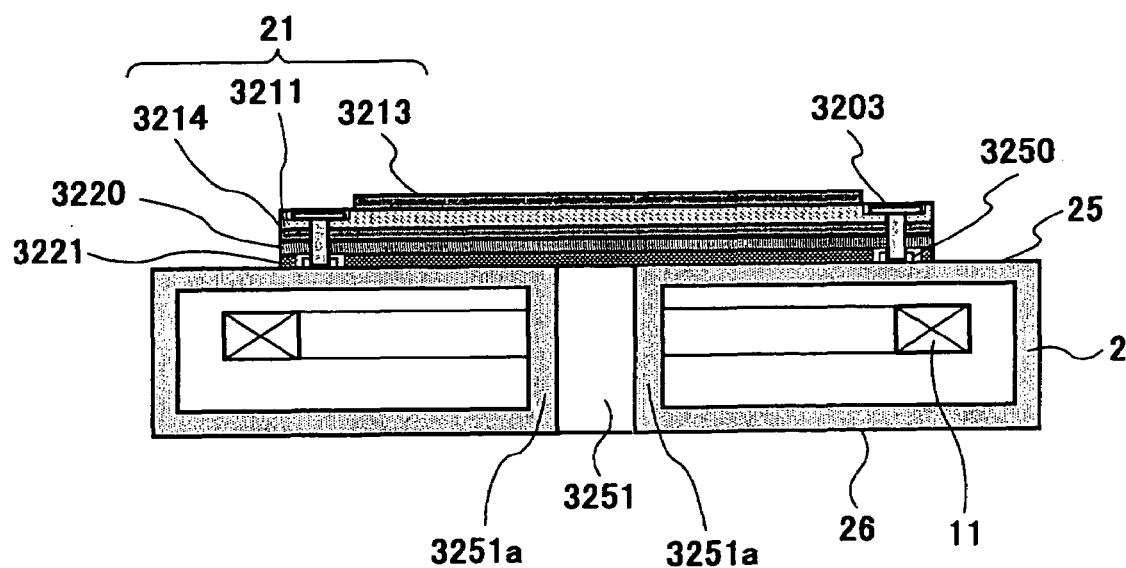
FIG. 30 is a sectional view of a lower superconducting magnet 101b according to the thirteenth embodiment.

The thirteenth embodiment of the MRI apparatus according to the present invention is shown in FIG. 30. In this embodiment, a through-hole 3251 is provided at the center part in order to strengthen the opposing face 25 side of the cryostat 2. The side wall 3251*a* of this through-hole 3251 plays a role of a column, and therefore it can improve the rigidity of the wall of the opposing face 25. The position of the through-hole 3251 is not limited to the central part as shown in FIG. 30. It may be provided at an off-center position, or a plurality of the holes may be provided. The thus provided through-hole 3251 can be also used as a pathway of the cables 8 (not shown in FIG. 30) or a piping for cooling. Alternatively, the gradient magnetic field coil 21 can also be anchored to the cryostat 2 using atmospheric pressure by increasing sealing between the through-hole 3251 and the gradient magnetic field coil 21 and decompressing the inside of the through-hole 3251 to vacuum. In this case, an advantage is provided, i.e., the structure concerning the fixation part on the side of the gradient magnetic field coil 21 is simplified.

Further, in the structure shown in FIG. 30, a nonmagnetic insulating member 3220 and a nonmagnetic conductive member 3221 are disposed between the gradient magnetic field coil 21 and the cryostat 2 having the same structures as those used in the eleventh embodiment. The nonmagnetic conductive member 3221 produces an eddy current inside induced by temporal fluctuation of a static magnetic field and thereby suppresses the temporal fluctuation of a static magnetic field caused by vibration of the superconducting magnets 101*a* and 101*b* and so forth. This technique is described in, for example, WO02/071942. The nonmagnetic conductive member 3221 preferably consists of a material having a high electric conductivity such as aluminum and copper. A hole can be provided in this nonmagnetic conductive member 3221 so that it can also be used as a tray for disposing a shim material. This nonmagnetic conductive member 3221 preferably has a thickness of about several millimeters to 30 mm.

The nonmagnetic insulating member 3220 produces the interval between of a coil pattern portion of the gradient magnetic field coil 21 and electric conductor portions such as the nonmagnetic conductive member 3221 to suppress generation of excessive eddy current in the nonmagnetic conductive member 3221. Degradation of image quality is thereby prevented. That is, while the pattern of the shield coil 3214 is designed so as to prevent the eddy current generated by the gradient magnetic field coil 21, if the distance with respect to the nonmagnetic conductive member 3221 is too small, the eddy current cannot be sufficiently suppressed. Therefore, by increasing the interval between the coil pattern portion of the gradient magnetic field coil 21 and electric conductor portions such as the nonmagnetic conductive member 3221, the aforementioned problem can be solved, and degradation of image quality can be prevented. As the nonmagnetic insulating member 3220 becomes thicker, the eddy current suppressing effect increases. However, the other components must be made thinner in order to secure an open space. Therefore, the actual thickness is preferably about several millimeters to ten and several millimeters. Further, it is also possible to dimensionally effectively use this portion by disposing a shim coil by molding etc.

In this thirteenth embodiment, the aforementioned members 3220 and 3221 inserted between the gradient magnetic field coil 21 and the cryostat 2 must be firmly integrated to the wall surface of the cryostat 2 together with the gradient magnetic field coil 21. For this purpose, for example, the nonmagnetic conductive member 3221 and the cryostat 2 can be anchored beforehand by adhesion, welding or the like, or the nonmagnetic conductive member 3221 can be formed as a cladding material of the cryostat 2. The cladding material referred to here is a composite material consisting of different metals rolled into one plate for bringing out the best characteristics of each material. In this embodiment, a stainless steel material, which is a common material for the cryostat 2, and a material having a high electric conductivity such as aluminum and copper used for the nonmagnetic conductive member 3221 are made into a composite material. The purpose of each member is thereby attained, and at the same time, the rigidity can be improved by integration of both of the members. Further, it is also possible to integrate the nonmagnetic insulating member 3220 and the gradient magnetic field coil 21 by adhesion, molding or the like, and workability for attachment etc. is also thereby improved.

By providing the through-hole 4 in the cryostat 2 to increase the rigidity of the cryostat 2 and fixing the gradient magnetic field coil 21 to the cryostat 2 to integrate them as in the thirteenth embodiment, vibration of the superconducting magnets 101*a* and 101*b* can be reduced. Further, by disposing the nonmagnetic conductive member 3221 and the nonmagnetic insulating member 3220, the magnetic characteristics of the superconducting magnets 101*a* and 101*b* can be improved.

In addition to the configuration of the thirteenth embodiment, a structure reinforcing member such as the thick plate reinforcing members 51 and 54 and the grid reinforcing members 52 and 56 of the first to seventh embodiments may of course be also fixed. In this case, the rigidity of the cryostat 2 can be further enhanced, and therefore vibration of the superconducting magnets 101*a* and 101*b* can be further reduced.

Fourteenth Embodiment

Figure 31A:
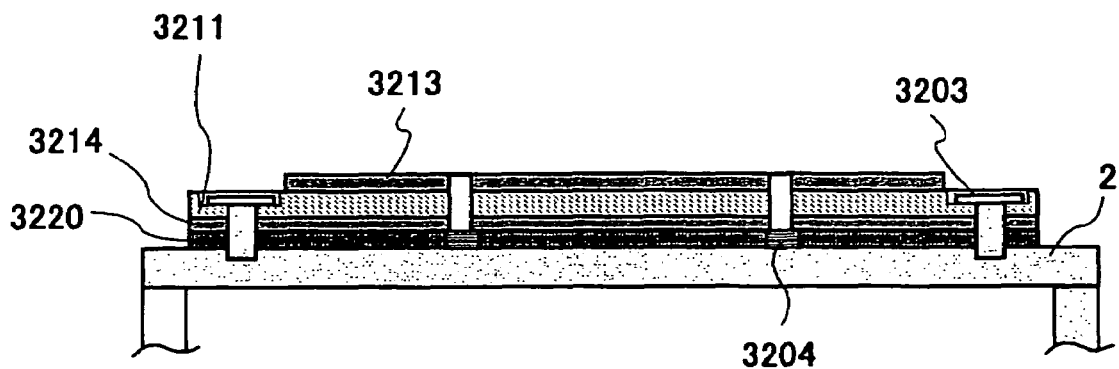
FIG. 31(a) is a sectional view of a lower superconducting magnet 101b according to the fourteenth embodiment, and FIG. 31(b) includes an enlarged sectional view of a part of FIG. 31(a) and a perspective view of a nut and a screw.
Figure 31B:
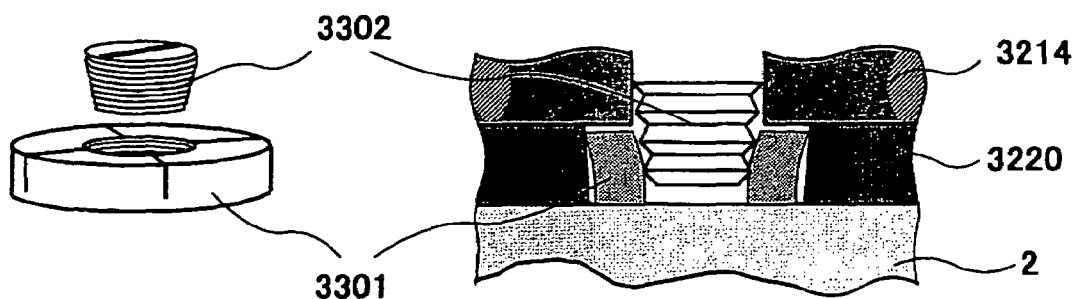

The fourteenth embodiment of the MRI apparatus of the present invention is shown in FIGS. 31(a) and (b). An enlarged view of a central fixation part 3204 shown in FIG. 31(a) is shown in FIG. 31(b). In this embodiment, a splitnut 3301 is used for attaching the gradient magnetic field coil 21. The splitnut 3301 is anchored to the wall of the cryostat 2 beforehand by welding, adhesion or the like. The nonmagnetic insulating member 3220 have been anchored to the gradient magnetic field coil 21. By inserting a tapered screw 3302 into the splitnut 3301, the outer periphery of the nut 3301 is expanded and pushes the inner surface of the nonmagnetic insulating member 3220, and thus fixation is attained. By using a tapered shape for the inner circumference surface of the nut 3301 instead of using the screw 3302, the same effect can be obtained. This fixing method has an advantage that the manufacture of the gradient magnetic field coil 21 becomes easy, because diameter of holes provided in the main coil 3213 and the intermediate material 3211 can be made small. Although the nonmagnetic conductive member 3221 is not shown in FIGS. 31(a) and (b), it is of course also possible to dispose the nonmagnetic conductive member 3221.

FIG. 32 shows an embodiment where a fixing bolt is used as the fixing member 3203, and the fixing bolt 3203 is fixed by using a base 3250. The intermediate member 3211 is provided on the imaging space side with a hole 3211a for accommodating the head portion of the fixing bolt 3203, and the remaining portion of intermediate material 3211 and the shield coil 3214 are provided with a through-hole 3214a through which the portion of the fixing bolt 3203 under the head can penetrate. This through-hole 3214a desirably has such an inner diameter that the wall surface of the hole should not substantially contact with the fixing bolt 3203. Further, the cryostat 2 as the receiving side is provided with a tapped hole. For this purpose, the cryostat 2 should have a wall thickness of a certain level or larger. When a sufficient thickness cannot be secured for the cryostat 2, a base 3250 is installed on the cryostat 2 on the opposing face 25 side, and the nonmagnetic insulating member 3220 is provided with a hole 3220a in which the base 3250 can be accommodated. By using these configurations, the intermediate material 3211 and the shield coil 3214 are fixed by pinching them between the head portion of the fixing bolt 3203 and the cryostat 2.

Although embodiments where the present invention is applied to the MRI apparatus having a pair of superconducting magnets perpendicularly disposed as a static magnetic field generating source are explained above, the MRI apparatus of the present invention is not limited to the aforementioned embodiments, and various modifications are possible. For example, the same structures may also be used for a coil for resistive type magnet. Further, the pair of static magnetic field generating sources may also be configured to be horizontally disposed.

Furthermore, although each embodiment was individually explained, a configuration utilizing the configurations of two or more of the embodiments in combination is also possible. For example, it is possible to combine the twelfth and thirteenth embodiments to provide both the cryostat reinforcing member 3210 and the through-hole 3251 for the cryostat 2 and thereby enhance the rigidity of the cryostat 2. Further, it is also possible to combine the eleventh and twelfth embodiments to put the gradient magnetic field coil reinforcing member 3205 of the eleventh embodiment on the gradient magnetic field coil 21 of the twelfth embodiment and thereby enhance the rigidity of the gradient magnetic field coil 21.

The invention claimed is:

1. A magnetic resonance imaging apparatus comprising a pair of static magnetic field generating sources opposingly disposed on both sides of an imaging space and gradient magnetic field generating part disposed on the imaging space side of each static magnetic field generating source for applying a gradient magnetic field to the imaging space, wherein the static magnetic field generating sources each comprise a magnetic field generating coil and a closed vessel enclosing the magnetic field generating coil inside, the gradient magnetic field generating part is supported on a face of the closed vessel on the imaging space side, at least one of the closed vessel has a rigid structure for preventing transmission of vibration generated by the gradient magnetic field generating part to other members via the closed vessel, the rigid structure has a rigid reinforcing member provided on the side confronting the face on the imaging space side of the closed vessel, the rigid structure has at least one connecting part connecting a face on the imaging space side and a face confronting the face of the closed vessel inside the closed vessel, the rigid reinforcing member is fixed on the face confronting the face on the imaging space side of the closed vessel, and the rigid reinforcing member comprises at least one of a plate member and a grid member.

2. The magnetic resonance imaging apparatus according to claim 1, wherein the plate member is integrally formed with the closed vessel by making a wall thickness of the face confronting the face on the imaging space side of the closed vessel larger than the wall thickness of the face on the imaging space side.

3. The magnetic resonance imaging apparatus according to claim 1, wherein each closed vessel has a first recess provided for the face on the imaging space side, the connecting part comprises one or more through-holes provided inside so as to penetrate from the face on the imaging space side to the face confronting the foregoing face, each gradient magnetic field generating part is fixed in the first recess, and in at least one of the through-holes, cables for gradient magnetic field for supplying a current to the gradient magnetic field generating part are disposed.

4. The magnetic resonance imaging apparatus according to claim 3, wherein the through-holes are provided near the side face of the first recess.

5. The magnetic resonance imaging apparatus according to claim 3, wherein at least one of the through-holes is provided at an approximate center of the first recess.

6. The magnetic resonance imaging apparatus according to claim 3, wherein the rigid reinforcing member is provided with one or more pathways communicating with the through-holes in the inside thereof, and the cables for gradient magnetic field are disposed in one of the pathways.

7. The magnetic resonance imaging apparatus according to claim 6, which further comprises a means for circulating a refrigerant for cooling the gradient magnetic field generating part, and wherein the gradient magnetic field generating part is provided with a means for passing the refrigerant inside, and piping for supplying the refrigerant to the gradient magnetic field generating part is disposed in at least one of the through-holes and a pathway communicating therewith.

8. The magnetic resonance imaging apparatus according to claim 7, which further comprises a pair of high frequency magnetic field generating parts for generating a high frequency magnetic field in the imaging space, and wherein each of the pair of high frequency magnetic field generating parts is disposed on the imaging space side with respect to the gradient magnetic field generating part, and in at least one of the through-holes and a pathway communicating therewith, cables for high frequency magnetic field for supplying a current to the high frequency magnetic field generating part are disposed.

9. The magnetic resonance imaging apparatus according to claim 8, wherein three or more of the through-holes are provided in the closed vessel, and the cables for gradient magnetic field, the cables for high frequency magnetic field and the piping are disposed individually in the different through-holes and the different pathways communicating therewith.

10. The magnetic resonance imaging apparatus according to claim 9, wherein the different pathways join inside the rigid reinforcing member to have a number smaller than the number of the through-holes, and communicate with the outside of the rigid reinforcing member.

11. The magnetic resonance imaging apparatus according to claim 10, wherein a partition is provided in the joined pathways for separating a space through which the cables for gradient magnetic field or the cables for high frequency magnetic field pass and a space through which the piping passes in the pathway, and the partition is constituted with a material of high thermal conductivity.

12. The magnetic resonance imaging apparatus according to claim 11, wherein the piping is disposed at a position perpendicularly under the cables for gradient magnetic field or the cables for high frequency magnetic field.

13. The magnetic resonance imaging apparatus according to claim 7, wherein the through-hole has an opening inside the first recess, the gradient magnetic field generating part has a refrigerant receiving terminal at a position of the opening of the through-hole, the piping has a refrigerant supplying terminal, and the refrigerant receiving terminal is connected to the refrigerant supplying terminal.

14. The magnetic resonance imaging apparatus according to claim 13, wherein the piping, the refrigerant supplying terminal and the refrigerant receiving terminal are constituted with a conductive material, so that they serve also as the cables for gradient magnetic field supplying an electric current to the gradient magnetic field generating part.

15. The magnetic resonance imaging apparatus according to claim 3, wherein the through-bole has an opening inside the first recess, the gradient magnetic field generating pan has a current receiving terminal at a position of the opening of the through-hole, the cables for gradient magnetic field have a current supplying terminal, and the current supplying terminal is connected to the current receiving terminal.

16. The magnetic resonance imaging apparatus according to claim 3, wherein the cables for gradient magnetic field is fixed in the through-hole with a fixing member.

17. The magnetic resonance imaging apparatus claim 1, wherein the closed vessel has a second recess in the face confronting the face on the imaging space side, and the rigid reinforcing member is disposed inside the second recess.

18. The magnetic resonance imaging apparatus according to claim 1, wherein the closed vessel comprises one or more through-holes provided inside so as to penetrate from the face on the imaging space side to the face confronting the foregoing face, an opening of the grid member is provided at a position corresponding to the through-holes.

19. The magnetic resonance imaging apparatus according to claim 1, wherein the rigid reinforcing member has the plate member including a plurality of separate members.

20. The magnetic resonance imaging apparatus according to claim 1, wherein each rigid reinforcing member of the closed vessels has the same reinforcing structure.

21. The A magnetic resonance imaging apparatus comprising a pair of static magnetic field generating sources opposingly disposed on both sides of an imaging space and a gradient magnetic field generating part disposed on the imaging space side of each static magnetic field generating source for applying a gradient magnetic field to the imaging space, wherein the static magnetic field generating sources each comprise a magnetic field generating coil and a closed vessel enclosing the magnetic field generating coil inside, the gradient magnetic field generating part is supported on a face of the closed vessel on the imaging space side, at least one of the closed vessel has a rigid structure for preventing transmission of vibration generated by the gradient magnetic field generating part to other members via the closed vessel, the rigid structure has a rigid reinforcing member provided on the side confronting the face on the imaging space side of the closed vessel, the rigid reinforcing member is integrally formed with the face confronting the face on the imaging space side of the closed vessel, and the rigid reinforcing member comprises at least one of a plate member and a grid member.

22. The magnetic resonance imaging apparatus according to claim 21, wherein the closed vessel comprises one or more through-holes provided inside so as to penetrate front the face on the imaging space side to the face confronting the foregoing face, an opening of the grid member is provided at a position corresponding to the through-holes.

23. The magnetic resonance imaging apparatus according to claim 21, wherein the rigid reinforcing member has the plate member including a plurality of separate members.

24. The magnetic resonance imaging apparatus according to claim 21, wherein the closed vessel comprises one or more through-holes provided inside so as to penetrate from the face on the imaging space side to the face confronting the foregoing face, the rigid reinforcing member has the plate member disposed only for a region of doughnut shape on the peripheral side from the through-holes.

25. The magnetic resonance imaging apparatus according to claim 21, wherein the plate member is integrally formed with the closed vessel by making a wall thickness of the face confronting the face on the imaging space side of the closed vessel larger than the wall thickness of the face on the imaging space side.

26. A magnetic resonance imaging apparatus comprising a pair of static magnetic field generating sources opposingly disposed an both sides of an imaging space and a gradient magnetic field generating part disposed on the imaging space side of each static magnetic field generating source for applying a gradient magnetic field to the imaging space, wherein the static magnetic field generating sources each comprise a magnetic field generating coil and a closed vessel enclosing the magnetic field generating coil inside, the gradient magnetic field generating part is supported on a face of the closed vessel on the imaging space side, at least one of the closed vessel has a rigid structure for preventing transmission of vibration generated by the gradient magnetic field generating part to other members via the closed vessel, the rigid structure has a rigid reinforcing member provided on the side confronting the face on the imaging space side of the closed vessel, and each rigid reinforcing member of the closed vessels has the different reinforcing structure.

27. The magnetic resonance imaging apparatus according to claim 26, wherein the rigid reinforcing member of upper closed vessel has the grid member, and the rigid reinforcing member of lower closed vessels has the plate member.

28. A magnetic resonance imaging apparatus comprising a pair of static magnetic field generating sources opposingly disposed on both sides of an imaging space and a gradient magnetic field generating part disposed on the imaging space side of each static magnetic field generating source for applying a gradient magnetic field to the imaging space, wherein the static magnetic field generating sources each comprise a magnetic field generating coil and a closed vessel enclosing the magnetic field generating coil inside, the gradient magnetic field generating part is supported on a face of the closed vessel on the imaging space side, at least one of the closed vessel has a rigid structure for preventing transmission of vibration generated by the gradient magnetic field generating part to other members via the closed vessel, the rigid structure has a rigid reinforcing member provided on the side confronting the face on the imaging space side of the closed vessel, and the reinforcing members of each closed vessel has different sizes or is made of different materials.

* * * * *